(12) United States Patent
Kanno et al.

(10) Patent No.: US 12,113,502 B2
(45) Date of Patent: Oct. 8, 2024

(54) METHOD OF MANUFACTURING QUARTZ CRYSTAL ELEMENT

(71) Applicant: SEIKO EPSON CORPORATION, Tokyo (JP)

(72) Inventors: Masaya Kanno, Okaya (JP); Shigeru Shiraishi, Ina (JP); Atsushi Matsuo, Shiojiri (JP)

(73) Assignee: SEIKO EPSON CORPORATION, Tokyo (JP)

( * ) Notice: Subject to any disclaimer, the term of this patent is extended or adjusted under 35 U.S.C. 154(b) by 678 days.

(21) Appl. No.: 17/229,065

(22) Filed: Apr. 13, 2021

(65) Prior Publication Data
US 2021/0328566 A1    Oct. 21, 2021

(30) Foreign Application Priority Data

Apr. 15, 2020  (JP) ................................. 2020-073073

(51) Int. Cl.
*H03H 3/013* (2006.01)
*H03H 3/02* (2006.01)
(Continued)

(52) U.S. Cl.
CPC ............. *H03H 3/013* (2013.01); *H03H 3/02* (2013.01); *H03H 2003/022* (2013.01);
(Continued)

(58) Field of Classification Search
CPC ............. H03H 9/02102; H03H 9/0547; H03H 9/1021; H03H 3/013; H03H 3/02;
(Continued)

(56) References Cited

U.S. PATENT DOCUMENTS

| 4,232,109 A * | 11/1980 | Kizaki | ...................... H03H 3/02 |
| | | | 216/48 |
| 2010/0028707 A1* | 2/2010 | Cowan | ................... H05G 2/008 |
| | | | 428/587 |

FOREIGN PATENT DOCUMENTS

| JP | 05090877 A * | 4/1993 | ......... H03H 9/02023 |
| JP | 2013-115534 | 6/2013 | |

OTHER PUBLICATIONS

Ozaki et al., "A 0.15 /spl mu/m KrF lithography for 1 Gb DRAM product using highly printable patterns and thin resist process," 1998 Symposium on VLSI Technology Digest of Technical Papers (Cat. No. 98CH36216), Honolulu, HI, USA, 1998, pp. 84-85. (Year: 1998).*

* cited by examiner

*Primary Examiner* — A. Dexter Tugbang
(74) *Attorney, Agent, or Firm* — Rankin, Hill & Clark LLP

(57) ABSTRACT

A method of manufacturing a quartz crystal element includes preparing a quartz crystal wafer having a predetermined cutting angle with respect to a crystal axis of a quartz crystal, forming a first resist film having a first tilted part on a first surface of the quartz crystal wafer and dry-etching the first resist film with the quartz crystal, forming a first tilted surface by dry-etching the quartz crystal wafer from the first surface side, forming a second resist film having a second tilted part on a second surface of the quartz crystal wafer and dry-etching the second resist film with the quartz crystal, and forming a second tilted surface tilted by dry-etching the quartz crystal wafer from the second surface side. The quartz crystal element provided with the first tilted surface and the second tilted surface, and having a cutting angle different from the predetermined cutting angle is formed.

2 Claims, 16 Drawing Sheets

(51) Int. Cl.
*H03H 9/19* (2006.01)
*H03H 9/02* (2006.01)
*H03H 9/05* (2006.01)
*H03H 9/10* (2006.01)

(52) U.S. Cl.
CPC . *H03H 2003/023* (2013.01); *H03H 2003/027* (2013.01); *H03H 9/02102* (2013.01); *H03H 9/0547* (2013.01); *H03H 9/1021* (2013.01); *H03H 9/19* (2013.01)

(58) Field of Classification Search
CPC .............. H03H 9/19; H03H 2003/022; H03H 2003/023; H03H 2003/027; H05G 2/008; H05K 2/008; Y10T 29/42
See application file for complete search history.

METHOD OF MANUFACTURING QUARTZ CRYSTAL ELEMENT

The present application is based on, and claims priority from JP Application Serial Number 2020-073073, filed Apr. 15, 2020, the disclosure of which is hereby incorporated by reference herein in its entirety.

BACKGROUND

1. Technical Field

The present disclosure relates to a method of manufacturing a quartz crystal element.

2. Related Art

In, for example, JP-A-2013-115534 (Document 1), there is described a method of manufacturing a quartz crystal substrate for high stability. Specifically, there are included a preparation step of preparing artificial quartz crystal which is lumbered so as to clarify crystal axes of the quartz crystal, a cutting step of cutting the artificial quartz crystal at a predetermined angle to form a quadrangular substrate, a block formation step of stacking a plurality of quadrangular substrates and then bonding the quadrangular substrates to each other with an adhesive to thereby form a block shaped like a quadrangular prism, a processing step of processing outer circumferential surfaces of the block into a circular cylindrical shape except one of the side surfaces, and a segmentalization step of dissolving the adhesive of the block to decompose the block in to segments to thereby obtain individual quartz crystal substrates. Therefore, the cutting angle of the individual quartz crystal substrate is determined by the cutting angle used when carving the quadrangular substrate from the artificial quartz crystal.

However, when it is attempted to manufacture quartz crystal substrates different in cutting angle from each other using the method of manufacturing the quartz crystal substrate described in Document 1, it is necessary to separately prepare the quadrangular substrates different in cutting angle from each other. In this case, although it is also possible to carve out the quadrangular substrates difference in cutting angle from a single artificial quartz crystal, when a plurality of cutting angles exist in a mixed manner, since it is unachievable to carve out the quadrangular substrates regularly and continuously in one direction, the number of the quadrangular substrates which are carved out from the artificial quartz crystal decreases. Therefore, it is necessary to prepare a plurality of artificial quartz crystals for the respective cutting angles to perform the cutting step described above for each of the artificial quartz crystals. In such a manner, when the plurality of artificial quartz crystals is prepared for the respective cutting angles, the manufacturing process of the quartz crystal substrate becomes complicated.

SUMMARY

A method of manufacturing a quartz crystal element according to the present disclosure includes preparing a quartz crystal wafer which has a predetermined cutting angle with respect to a crystal axis of a quartz crystal, and which has a first surface and a second surface having an obverse-reverse relationship, forming a first resist film on the first surface, the first resist film having a first tilted part tilted with respect to the first surface, and being dry-etched together with the quartz crystal, forming a first tilted surface tilted with respect to the first surface by dry-etching the quartz crystal wafer from the first surface side, forming a second resist film on the second surface, the second resist film having a second tilted part tilted with respect to the second surface, and being dry-etched together with the quartz crystal, and forming a second tilted surface tilted with respect to the second surface by dry-etching the quartz crystal wafer from the second surface side, wherein the quartz crystal element which is provided with the first tilted surface and the second tilted surface, and which has a cutting angle different from the predetermined cutting angle is formed.

DESCRIPTION OF EXEMPLARY EMBODIMENTS

A method of manufacturing a quartz crystal element according to the present disclosure will hereinafter be described in detail based on some embodiments shown in the accompanying drawings.

First Embodiment

Figure 1:
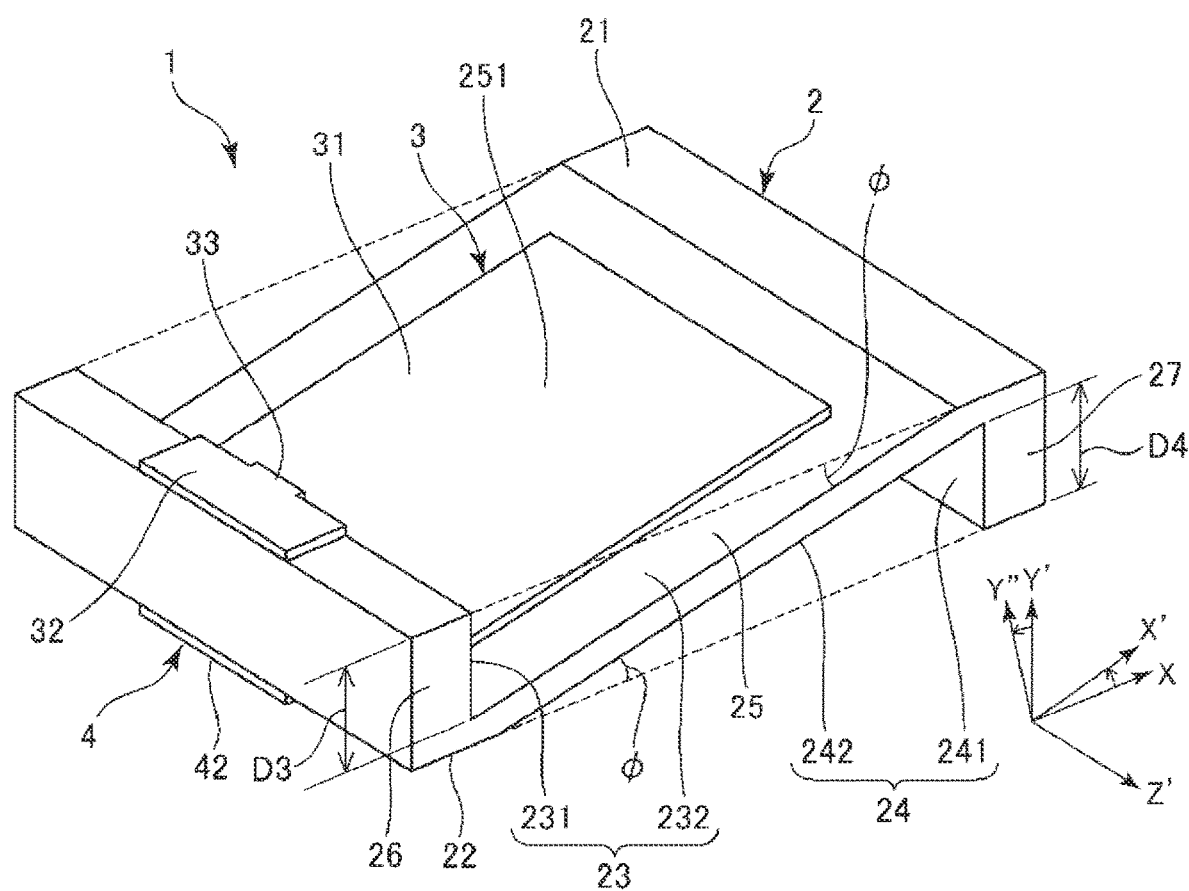
FIG. 1 is a perspective view showing a resonator element according to a first embodiment of the present disclosure.
Figure 2:
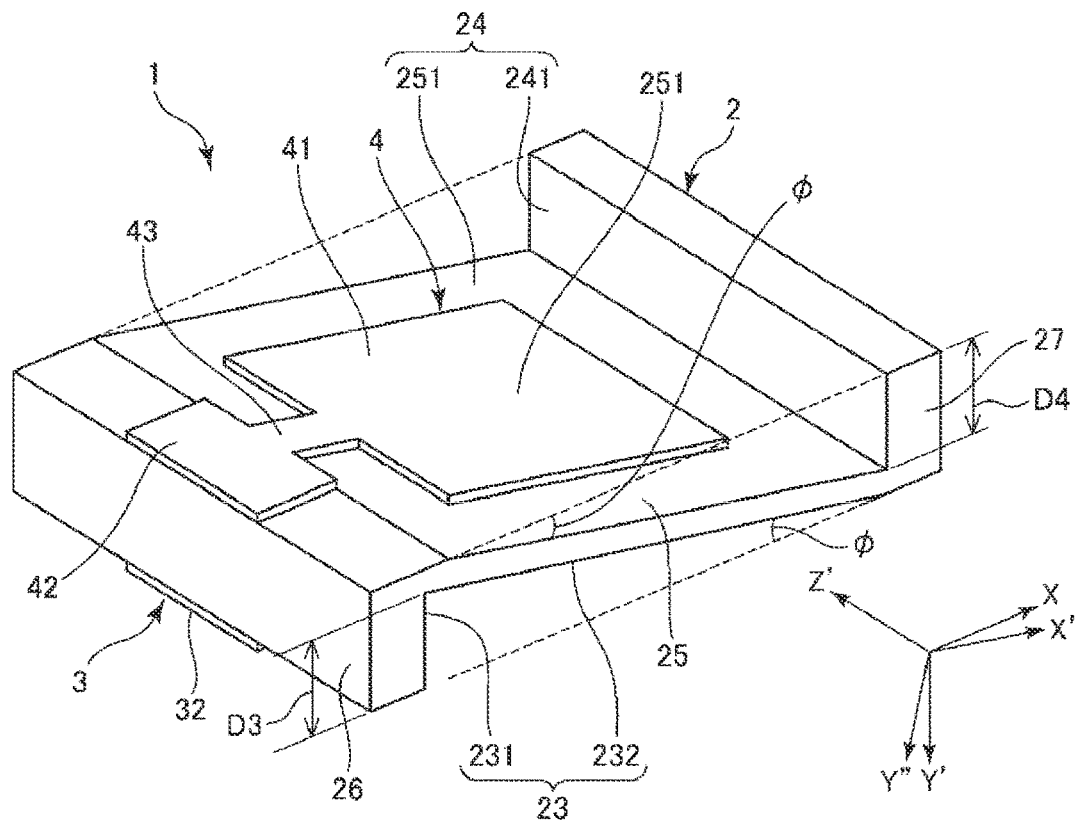
FIG. 2 is a perspective view of the resonator element shown in FIG. 1 viewed from a lower surface side.
Figure 3:
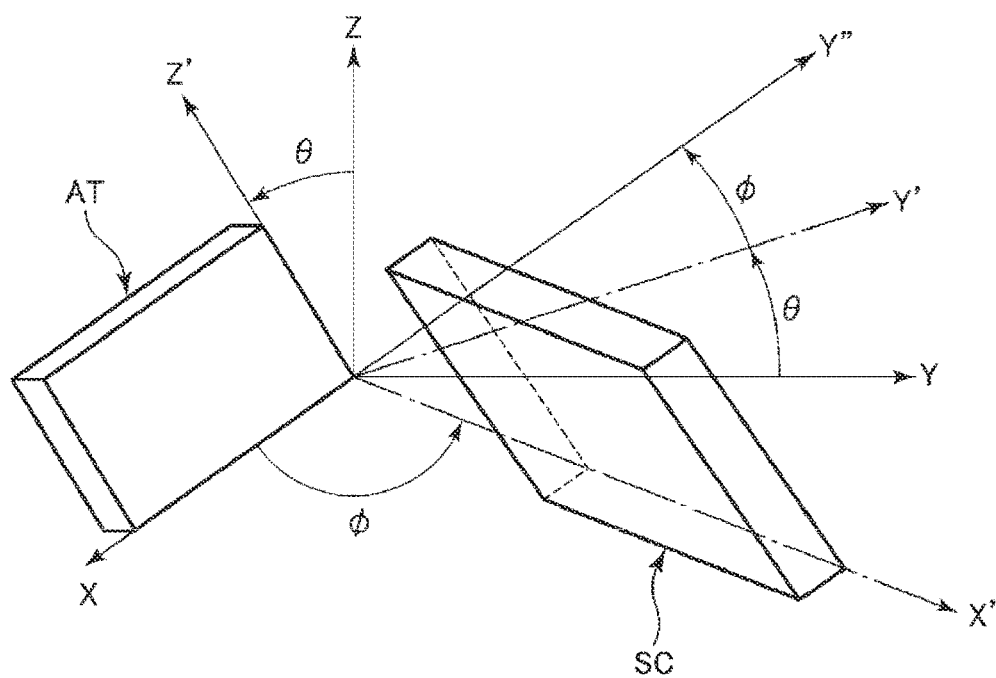
FIG. 3 is a diagram showing a cutting angle of a quartz crystal.
Figure 4:
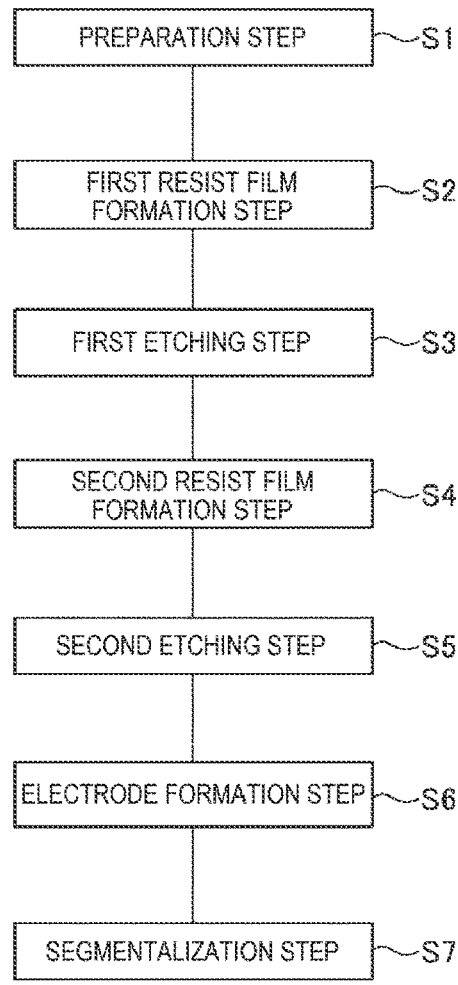
FIG. 4 is a flowchart showing a manufacturing process of the resonator element.
Figure 9:
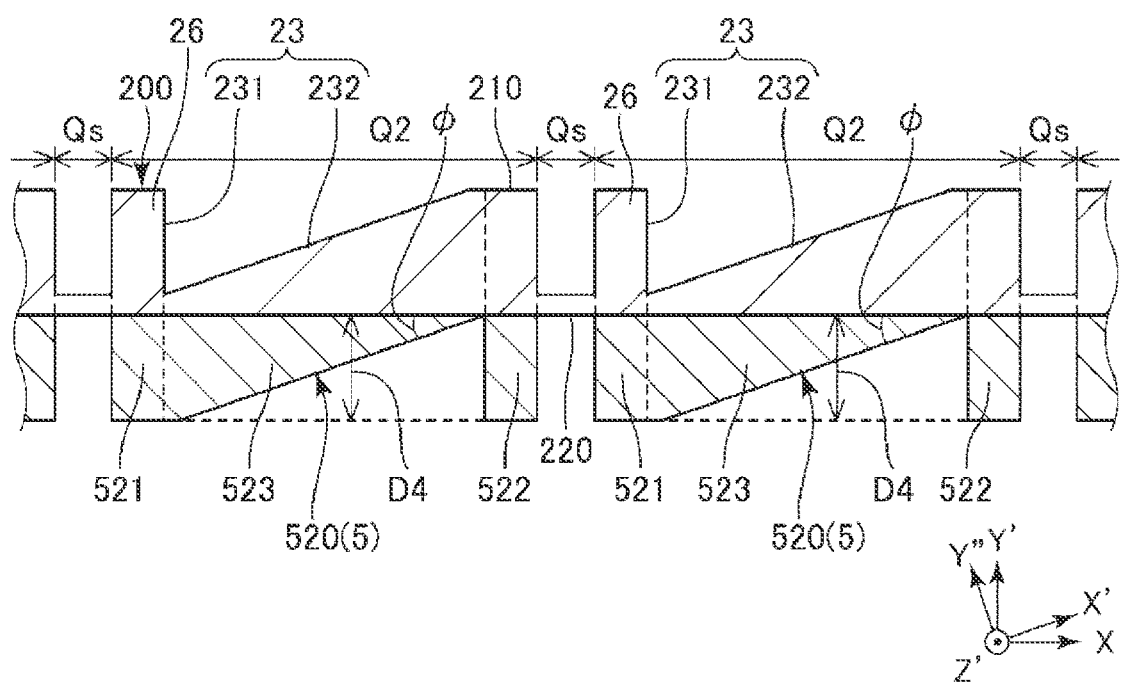
FIG. 9 is a cross-sectional view for explaining the method of manufacturing the resonator element.
Figure 10:
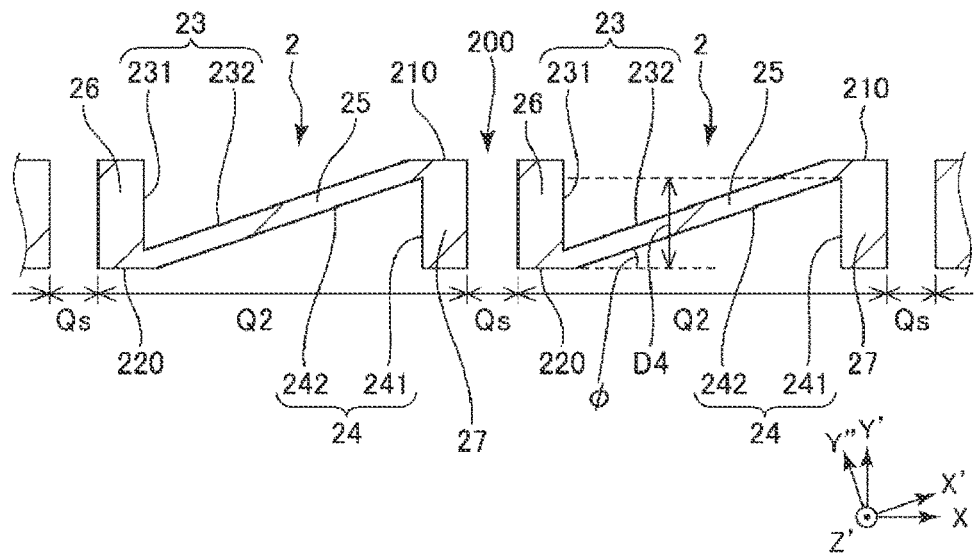
FIG. 10 is a cross-sectional view for explaining the method of manufacturing the resonator element.
Figure 11:
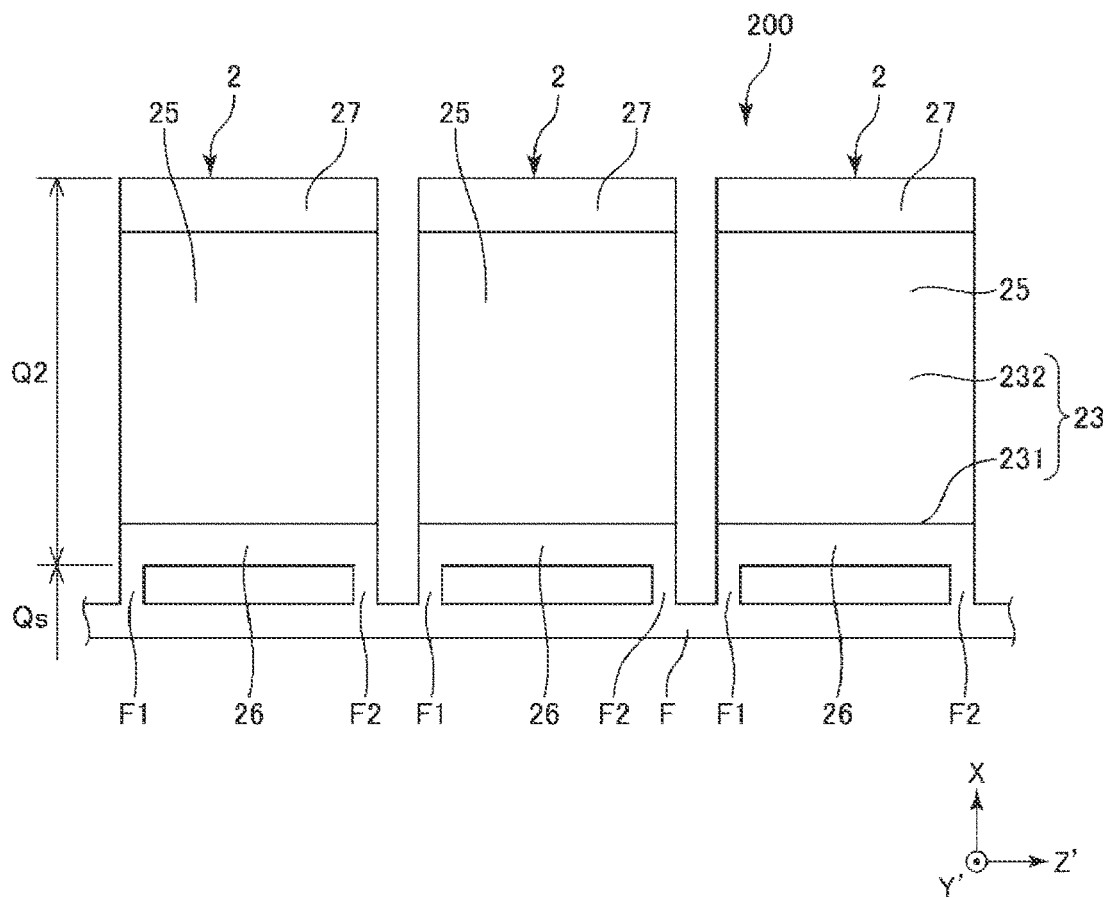
FIG. 11 is a plan view for explaining the method of manufacturing the resonator element.
Figure 12:
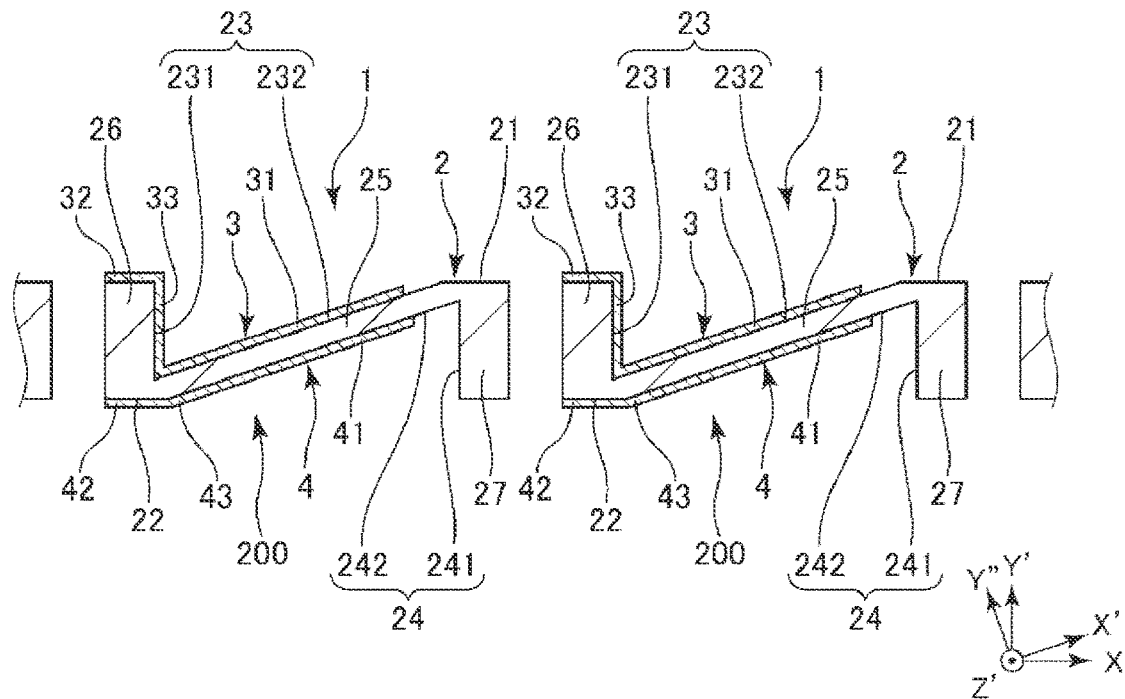
FIG. 12 is a cross-sectional view for explaining the method of manufacturing the resonator element.

FIG. 1 is a perspective view showing a resonator element according to a first embodiment of the present disclosure. FIG. 2 is a perspective view of the resonator element shown in FIG. 1 viewed from a lower surface side. FIG. 3 is a diagram showing a cutting angle of a quartz crystal. FIG. 4 is a flowchart showing a manufacturing process of the resonator element. FIG. 5 through FIG. 10 are cross-sectional views for explaining a method of manufacturing the resonator element. FIG. 11 is a plan view for explaining the method of manufacturing the resonator element. FIG. 12 is a cross-sectional view for explaining the method of manufacturing the resonator element.

A resonator element 1 shown in FIG. 1 and FIG. 2 is an SC-cut quartz crystal resonator element. The resonator element 1 has a quartz crystal substrate 2 as a quartz crystal element, and a pair of electrodes 3, 4 provided to the quartz crystal substrate 2. The SC-cut resonator element 1 has a thickness-shear vibration mode, and it is possible to suppress a frequency variation caused by a stress to a low level compared to, for example, an AT-cut resonator element having the same thickness-shear vibration mode. Therefore, the resonator element 1 is made excellent in frequency stability.

Here, the AT cut and the SC cut are briefly described. As shown in FIG. 3, the quartz crystal has crystal axes X, Y, and Z perpendicular to each other. The X axis, the Y axis, and the Z axis are called an electrical axis, a mechanical axis, and an optical axis, respectively. The AT cut means a cutting angle used when carving out an object from a plane obtained by rotating a plane perpendicular to the Y axis around the X axis as much as $\theta=34°55'$ through $35°55'$. As described above, the AT cut applies a single rotation to a predetermined axis, and is therefore also referred to as "single-rotation cut." In contrast, the SC cut means a cutting angle used when carving out an object from a plane obtained by rotating a plane perpendicular to the Y axis around the X axis as much as about $\theta=33°$ through $35°35'$, and further rotating the plane around a Z' axis as much as about $\varphi=22°$ through $24°$ from the position where the plane is located after the rotation. As described above, the SC cut applies two rotations to a predetermined axis, and is therefore also referred to as "double-rotation cut."

As is obvious from the relationship described above, the SC cut is achieved by carving out the object from the plane obtained by rotating the cutting plane of the AT cut around the Z' axis as much as about $\varphi=22°$ through $24°$. Therefore, in the method of manufacturing the quartz crystal substrate 2 according to the present embodiment, the SC-cut quartz crystal substrate 2 is manufactured by preparing the artificial quartz crystal as a lumbered quartz crystal with the clarified crystal axes of the quartz crystal, carving out an AT-cut quartz crystal wafer 200 from the artificial quartz crystal, and processing the both principal surfaces of the quartz crystal wafer 200 to be tilted surfaces rotated around the Z' axis as much as about $\varphi=22°$ through $24°$.

It should be noted that in the drawings except FIG. 4, for the sake of convenience of explanation, the X axis, the Y axis, and the Z axis after the rotation for the AT cut are respectively illustrated as the X axis, a Y' axis and the Z' axis, and the X axis, the Y axis, and the Z axis after the rotation for the SC cut are respectively illustrated as an X' axis, a Y" axis and the Z' axis. Further, a direction parallel to the X' axis is also referred to as an X'-axis direction, a direction parallel to the Y" axis is also referred to as a Y"-axis direction, and a direction parallel to the Z' axis is also referred to as a Z'-axis direction. Further, the arrow side of each of the axes is also referred to as a positive side, and the opposite side is also referred to as a negative side. Further, the positive side in the Y"-axis direction is also referred to as an "upper side," and the negative side thereof is also referred to as a "lower side."

According to such a manufacturing method, the quartz crystal wafer which is prepared for manufacturing the AT-cut quartz crystal substrate can also be used for the formation of the SC-cut quartz crystal substrate 2. Therefore, there is no need to separately carve out the SC-cut quartz crystal wafer from the artificial quartz crystal in order to form the SC-cut quartz crystal substrate 2. As described above, according to the method of manufacturing the quartz crystal substrate 2 related to the present embodiment, since there is no need to prepare the quartz crystal wafers for the respective cutting angles different from each other, it is possible to simplify the manufacturing process of the quartz crystal substrate 2.

In particular, when carving out the quartz crystal wafer of the double-rotation cut such as the SC cut from the artificial quartz crystal, it is necessary to prepare the lumbered artificial quartz crystal dedicated thereto. However, according to the manufacturing method related to the present embodiment, it becomes unnecessary to prepare the dedicated quartz crystal wafer. Therefore, it is also possible to reduce the manufacturing cost of the quartz crystal substrate 2. In particular, when the demand for the SC-cut quartz crystal resonator element is extremely low compared to the demand for the AT-cut quartz crystal resonator element, significant cost reduction is achieved. Further, since it is also possible to reduce the time consumed for preparing the dedicated quartz crystal wafer, it is possible to shorten the time taken for the manufacture of the quartz crystal substrate 2.

As shown in FIG. 1 and FIG. 2, the quartz crystal substrate 2 is shaped like a plate carved out with the AT cut. Further, the planar shape of the quartz crystal substrate 2 is a rectangular shape. In particular, in the present embodiment, the planar shape is an oblong having long sides in the X'-axis direction, and short sides in the Z'-axis direction. Further, the quartz crystal substrate 2 has an upper surface 21 and a lower surface 22. The upper surface 21 and the lower surface 22 are in an obverse-reverse relationship. Further, the quartz crystal substrate 2 has a first recessed part 23 opening in the upper surface 21, and a second recessed part 24 opening in the lower surface 22. The first recessed part 23 and the second recessed part 24 overlap each other in a plan view from the Y"-axis direction.

The first recessed part 23 opens in side surfaces on both sides in the Z'-axis direction of the quartz crystal substrate 2. Further, the first recessed part 23 has a substantially "V" shape in a cross-sectional view from the Z'-axis direction, and has a first side surface 231 perpendicular to the upper surface 21, and a first tilted surface 232 which is located at the positive side in the X'-axis direction of the first side surface 231, and is tilted with respect to the upper surface 21. Similarly, the second recessed part 24 opens in side surfaces on both sides in the Z'-axis direction of the quartz crystal substrate 2. Further, the second recessed part 24 has a substantially "V" shape in the cross-sectional view from the Z'-axis direction, and has a second side surface 241 perpendicular to the lower surface 22, and a second tilted surface 242 which is located at the negative side in the X'-axis direction of the second side surface 241, and is tilted with respect to the lower surface 22. The first recessed part 23 and the second recessed part 24 are formed so as to be rotationally symmetric about the center of the quartz crystal substrate 2 in the cross-sectional view from the Z'-axis direction. Therefore, the quartz crystal substrate 2 has an "N" shape in the cross-sectional view from the Z'-axis direction. It should be noted that hereinafter, a maximum depth of the first recessed part 23 is denoted by D3, and a maximum depth of the second recessed part 24 is denoted by D4. Further, D3=D4 is true.

Further, the quartz crystal substrate 2 has a base part 25, a first protruding part 26, and a second protruding part 27, wherein the base part 25 is an area sandwiched by the first tilted surface 232 and the second tilted surface 242, the first protruding part 26 protrudes upward from an end part at the negative side in the X'-axis direction of the base part 25, and has a bottom surface formed of the lower surface 22 and a top surface formed of the upper surface 21, and the second protruding part 27 protrudes downward from an end part at the positive side in the X'-axis direction of the base part 25, and has a bottom surface formed of the upper surface 21 and a top surface formed of the lower surface 22.

Further, the first tilted surface 232 and the second tilted surface 242 are parallel to each other, and a thickness T of the base part 25 is substantially equal in the entire area thereof. Further, the first tilted surface 232 is tilted as much as about 22° through 24° around the Z axis with respect to the upper surface 21, and the second tilted surface 242 is tilted as much as about 22° through 24° around the Z axis with respect to the lower surface 22. Thus, the base part 25 becomes an SC-cut area formed of the SC cut.

Further, as shown in FIG. 1, the electrode 3 has a first excitation electrode 31, a first terminal 32, and a first coupling interconnection 33, wherein the first excitation electrode 31 is disposed in a central part of the first tilted surface 232, the first terminal 32 is disposed on the upper surface 21 of the first protruding part 26, and the first coupling interconnection 33 electrically couples the first excitation electrode 31 and the first terminal 32 to each other. In contrast, as shown in FIG. 2, the electrode 4 has a second excitation electrode 41, a second terminal 42, and a second coupling interconnection 43, wherein the second excitation electrode 41 is disposed in a central part of the second tilted surface 242 so as to be opposed to the first excitation electrode 31, the second terminal 42 is disposed on the lower surface 22 of the first protruding part 26, and the second coupling interconnection 43 electrically couples the second excitation electrode 41 and the second terminal 42 to each other.

In the resonator element 1, a part of the base part 25 sandwiched by the first excitation electrode 31 and the second excitation electrode 41 corresponds to a vibrating part 251 which vibrates in the thickness-shear vibration mode. Further, since the vibrating part 251 is formed of the SC-cut area, the resonator element 1 corresponds to an SC-cut quartz crystal resonator element formed from the AT-cut quartz crystal substrate 2.

It should be noted that the configuration of the resonator element 1 is not limited thereto. For example, the planar shape of the quartz crystal substrate 2 is not limited to the oblong having the long sides in the X'-axis direction, but can be an oblong having the long sides in the Z'-axis direction, or can also be a square equal in length in the X'-axis direction and the Z'-axis direction. Further, the planar shape of the quartz crystal substrate 2 can have a shape other than the rectangular shape such as a circular shape, an elliptical shape, or an irregular shape. Further, although the first protruding part 26 and the second protruding part 27 are separately disposed at the both end parts in the X'-axis direction in the resonator element 1 in the present embodiment, this is not a limitation, and for example, it is possible to omit at least one of the first protruding part 26 and the second protruding part 27, or it is also possible for the protruding part to have a ring-like shape surrounding the base part 25.

Then, a method of manufacturing the resonator element 1 will be described. As shown in FIG. 4, the manufacturing process of the resonator element 1 includes a preparation step S1 of preparing the AT-cut quartz crystal wafer 200 as a parent material of the quartz crystal substrate 2, a first resist film formation step S2 of forming a first resist film 510 on an upper surface 210 of the quartz crystal wafer 200, a first etching step S3 of etching the quartz crystal wafer 200 via the first resist film 510, a second resist film formation step S4 of forming a second resist film 520 on a lower surface 220 of the quartz crystal wafer 200, a second etching step S5 of etching the quartz crystal wafer 200 via the second resist film 520, an electrode formation step S6 of providing the electrodes 3, 4 to the quartz crystal substrate 2 formed in the quartz crystal wafer 200, and a segmentalization step S7 of segmentalizing the resonator element 1. Among these steps, the preparation step S1 through the second etching step S5 correspond to the manufacturing process of the quartz crystal substrate 2.

Preparation Step S1

Figure 5:
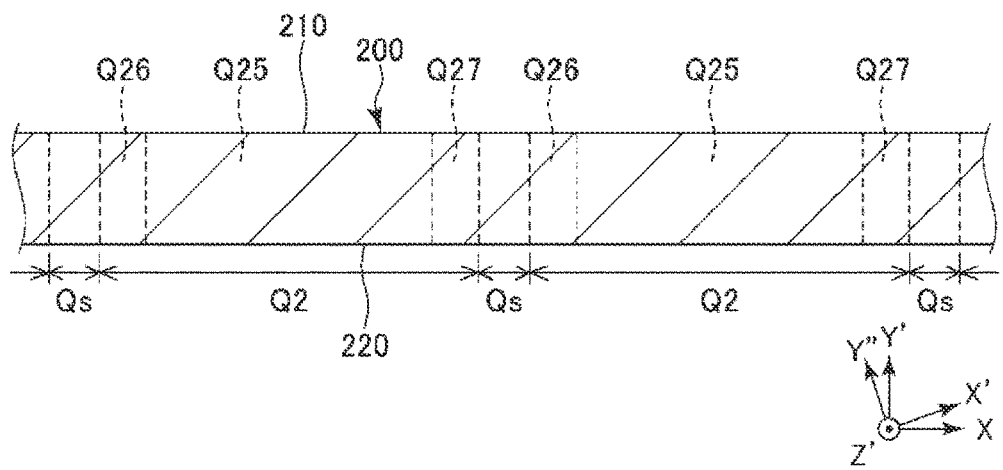
FIG. 5 is a cross-sectional view for explaining a method of manufacturing the resonator element.

First, as shown in FIG. 5, the AT-cut quartz crystal wafer 200 as the parent material of the quartz crystal substrate 2 is prepared. The quartz crystal wafer 200 has the upper surface 210 as a first surface and the lower surface 220 as a second surface. The upper surface 210 and the lower surface 220 are in an obverse-reverse relationship. The quartz crystal wafer 200 is larger than the quartz crystal substrate 2, and it is possible to form a plurality of quartz crystal substrates 2 from the quartz crystal wafer 200. It should be noted that an area which turns to the quartz crystal substrate 2 is hereinafter also referred to as an element area Q2. Further, each of the element areas Q2 includes a base part area Q25, a first protruding part area Q26, and a second protruding part area Q27 which turn to the base part 25, the first protruding part 26, and the second protruding part 27, respectively, due to the first etching step S3 to be performed later. It should be noted that the quartz crystal wafer 200 can be obtained by cutting the lumbered artificial quartz crystal with the AT cut.

Then, grinding processing for thickness adjustment and planarization is performed on both surfaces of the quartz crystal wafer 200 as needed. Such grinding processing is also called lapping processing. For example, using a wafer polishing device provided with a pair of surface plates disposed vertically, the quartz crystal wafer 200 is clamped between the surface plates rotating in respective directions opposite to each other to polish the both surfaces of the quartz crystal wafer 200 while rotating the quartz crystal wafer 200 and at the same time supplying a polishing fluid. It should be noted that in the grinding processing, it is possible to perform mirror polishing processing on the both surfaces of the quartz crystal wafer 200 as needed in succession to the lapping processing described above. Such grinding processing is also called polishing processing. Thus, it is possible to provide the both surfaces of the quartz crystal wafer 200 with mirrored surfaces.

First Resist Film Formation Step S2

Figure 6:
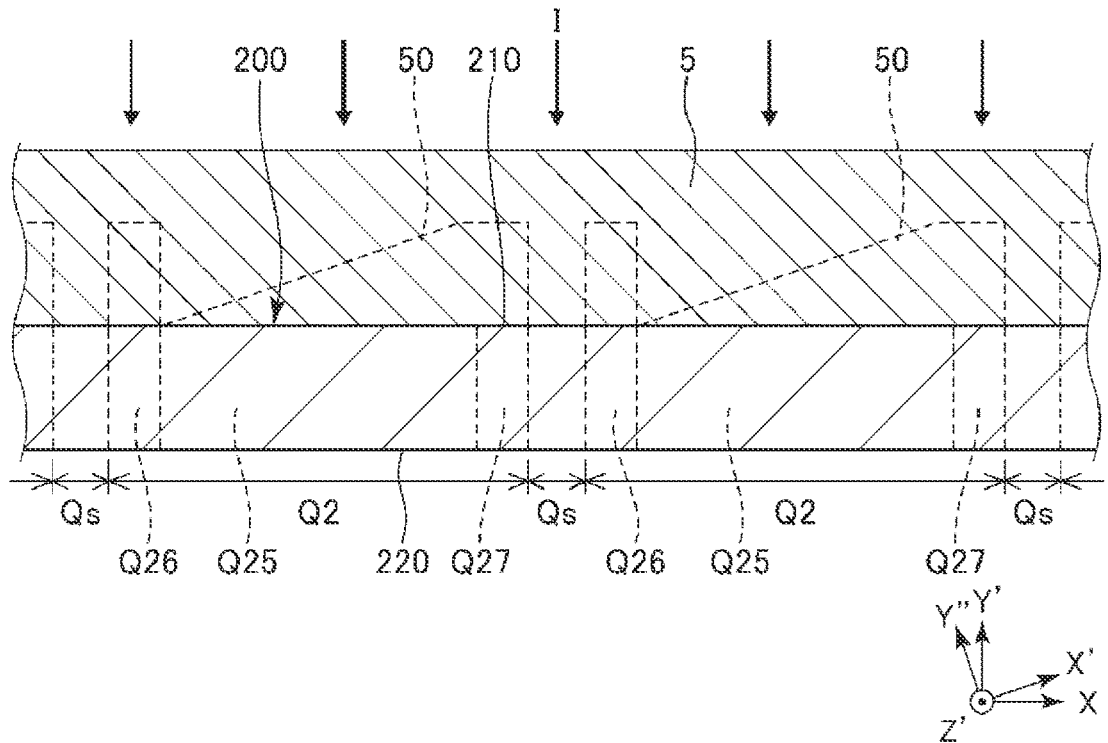
FIG. 6 is a cross-sectional view for explaining the method of manufacturing the resonator element.

First, as shown in FIG. 6, a resist material 5 is applied to the upper surface 210 of the quartz crystal wafer 200 with a predetermined thickness. As the resist material 5, there is used a material which is etched together with the quartz crystal in the first etching step S3 to be performed later. Then, the portions of the element areas Q2 are irradiated with an electromagnetic wave the exposure intensity of which is varied using a filter, a mask, or the like to thereby form exposure boundary areas 50 due to presence or absence of the exposure in the resist material 5.

Figure 7:
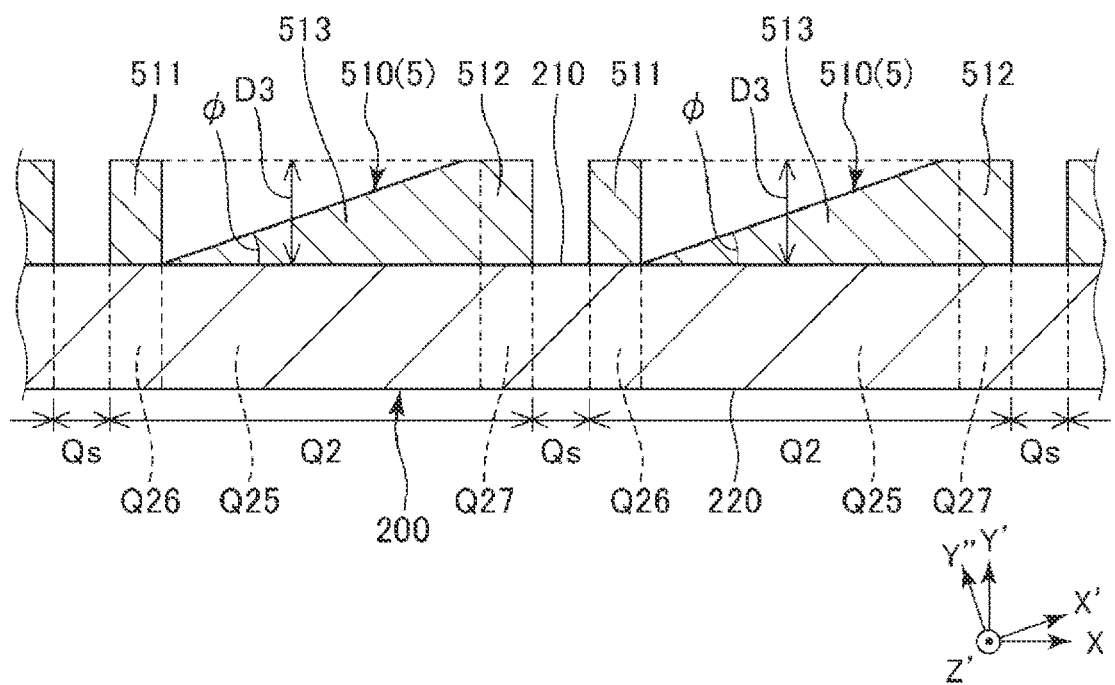
FIG. 7 is a cross-sectional view for explaining the method of manufacturing the resonator element.

Subsequently, the resist material 5 is developed. Thus, as shown in FIG. 7, the first resist film 510 made of the resist material 5 is formed on the element areas Q2. It should be noted that it is hereinafter assumed that the etching rate of the first resist film 510 and the etching rate of the quartz crystal are equal to each other for the sake of convenience of explanation. In the first resist film 510, the thickness of a part 511 overlapping the first protruding part area Q26 and the thickness of a part 512 overlapping the second protruding part area Q27 are each the same as the maximum depth D3 of the first recessed part 23. Further, a first tilted part 513 as a part overlapping the base part area Q25 is tilted as much as about $\varphi=22°$ through 24° around the Z axis with respect to the upper surface 210, and the thickness thereof gradually increases from 0 (zero) to D3 in a direction from the first protruding part area Q26 toward the second protruding part area Q27.

First Etching Step S3

Figure 8:
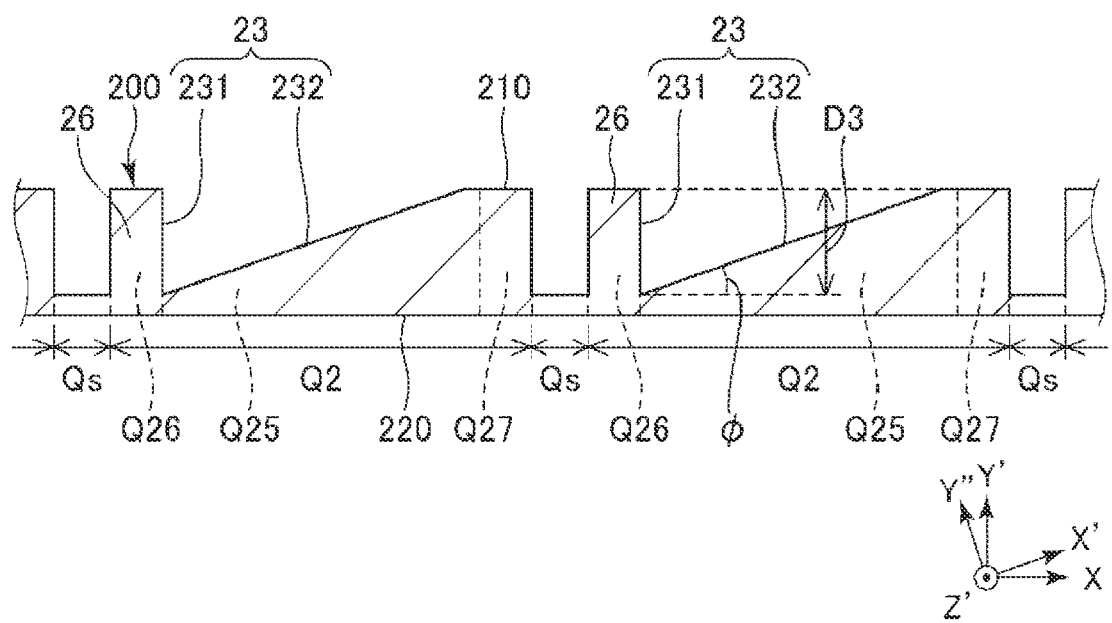
FIG. 8 is a cross-sectional view for explaining the method of manufacturing the resonator element.

Then, the quartz crystal wafer 200 is dry-etched from the upper surface 210 side via the first resist film 510. As described above, since the first resist film 510 is etched together with the quartz crystal wafer 200, the etching starts also in a part of the quartz crystal wafer 200 overlapping the first resist film 510 as soon as the first resist film 510 is removed. Therefore, the shape of the first resist film 510 is transferred to the upper surface 210 of each of the element areas Q2. As shown in FIG. 8, the dry etching ends when the etching depth from the upper surface 210 reaches D3. In other words, in the present embodiment, the dry etching ends at the time point when the first resist film 510 disappears. Thus, the first recessed part 23 is formed at the upper surface 210 side of each of the element areas Q2.

Further, the first resist film 510 is not formed on an area Qs between the element areas Q2 adjacent to each other. Therefore, the part corresponding to the area Qs is also dug forward until the etching depth reaches D3, and thus, a part of the outline shape of the quartz crystal substrate 2, namely the outline shape at the upper surface 210 side, is formed.

It should be noted that the shape of the first resist film 510 is not particularly limited as long as the first recessed parts 23 can be formed in the present step. Further, when the first resist film 510 remains when the present step ends, it is sufficient to remove the first resist film 510 before the electrode formation step S6.

Second Resist Film Formation Step S4

The present step is a step of performing the first resist film formation step S2 described above also on the lower surface 220 of the quartz crystal wafer 200. Specifically, first, the resist material 5 is applied to the lower surface 220 of the quartz crystal wafer 200 with a predetermined thickness. Then, the portions of the element areas Q2 are irradiated with an electromagnetic wave I the exposure intensity of which is varied using a filter, a mask, or the like to thereby form the exposure boundary areas 50 due to presence or absence of the exposure in the resist material 5. Subsequently, the resist material 5 is developed. Thus, as shown in FIG. 9, the second resist film 520 made of the resist material 5 is formed on the element areas Q2. In the second resist film 520, the thickness of a part 521 overlapping the first protruding part area Q26 and the thickness of a part 522 overlapping the second protruding part area Q27 are each the same as the maximum depth D4 of the second recessed part 24. Further, a second tilted part 523 as a part overlapping the base part area Q25 is tilted as much as about $\varphi=22°$ through 24° around the Z axis with respect to the lower surface 220, and the thickness thereof gradually increases from 0 (zero) to D4 in a direction from the second protruding part area Q27 toward the first protruding part area Q26.

Second Etching Step S5

The present step is a step of performing the first etching step S3 described above also on the lower surface 220 of the quartz crystal wafer 200. Specifically, first, the quartz crystal wafer 200 is dry-etched from the lower surface 220 side via the second resist film 520. Thus, the shape of the second resist film 520 is transferred to the lower surface 220 of each of the element areas Q2. As shown in FIG. 10, the dry etching ends when the etching depth from the lower surface 220 reaches D4. Thus, the second recessed part 24 is formed at the lower surface 220 side of each of the element areas Q2. Further, since the second resist film 520 is not formed on the area Qs, the part corresponding to the area Qs is also dug forward until the etching depth reaches D4. Further, by the part corresponding to the area Qs being communicated with the recessed part provided to the upper surface 210 in the first etching step S3, the outline shape of the quartz crystal substrate 2 is formed. Thus, the plurality of quartz crystal substrates 2 each provided with the SC-cut base part 25 is formed in the quartz crystal wafer 200.

It should be noted that in the first resist film formation step S2 described above through the second etching step S5, as shown in FIG. 11, a frame F, and a pair of coupling beams F1, F2 for coupling the frame F and each of the quartz crystal substrates 2 to each other are formed in the area Qs. Thus, it is possible to prevent each of the quartz crystal substrates 2 from being segmentalized and separated from the quartz crystal wafer 200 when the present process ends.

It should be noted that the shape of the second resist film 520 is not particularly limited as long as the second recessed parts 24 can be formed in the present step. Further, when the second resist film 520 remains when the present step ends, it is sufficient to remove the second resist film 520 before the electrode formation step S6.

Electrode Formation Step S6

Then, as shown in FIG. 12, the electrodes 3, 4 are provided to each of the quartz crystal substrates 2. Thus, the plurality of resonator elements 1 is formed in the quartz crystal wafer 200. The method of forming the electrodes 3, 4 is not particularly limited, but the electrodes 3, 4 can be formed by, for example, depositing a metal film on a surface of each of the quartz crystal substrates 2 and then patterning the metal film using a photolithography technique and an etching technique.

Segmentalization Step S7

Then, each of the resonator elements 1 is broken off at the coupling beams F1, F2 to thereby be segmentalized. Thus, the plurality of resonator elements 1 thus segmentalized can be obtained. It should be noted that the method of segmentalizing the resonator elements 1 is not particularly limited, and it is possible to achieve the segmentalization by, for example, dicing or etching.

According to such a manufacturing method, it is possible to manufacture the SC-cut quartz crystal substrate 2 from the AT-cut quartz crystal wafer 200. In other words, the quartz crystal wafer 200 which is prepared for manufacturing the AT-cut quartz crystal substrate can also be used for the formation of the SC-cut quartz crystal substrate 2. Therefore, there is no need to separately carve out the SC-cut quartz crystal wafer from the artificial quartz crystal in order to form the SC-cut quartz crystal substrate 2. As described above, according to the method of manufacturing the quartz crystal substrate 2 related to the present embodiment, since there is no need to prepare the quartz crystal wafers dedicated to the respective cutting angles different from each other, it is possible to simplify the manufacturing process of the quartz crystal substrate 2.

In particular, when carving out the quartz crystal wafer of the double-rotation cut such as the SC cut from the artificial quartz crystal, it is necessary to prepare the lumbered artificial quartz crystal dedicated thereto. However, according to the method of manufacturing the quartz crystal substrate 2 related to the present embodiment, it becomes unnecessary to prepare the dedicated quartz crystal wafer. Therefore, it is also possible to reduce the manufacturing cost of the quartz crystal substrate 2. In particular, when the demand for the SC-cut quartz crystal resonator element is extremely low compared to the demand for the AT-cut quartz crystal resonator element, significant cost reduction is achieved. Further, since it is also possible to reduce the time consumed for preparing the dedicated quartz crystal wafer, it is possible to shorten the time taken for the manufacture of the quartz crystal substrate 2.

It should be noted that although the SC-cut quartz crystal substrate 2 is manufactured from the AT-cut quartz crystal wafer 200 in the present embodiment, the cutting angle of the quartz crystal wafer 200 and the cutting angle of the quartz crystal substrate 2 are not particularly limited as long as they are different from each other. For example, it is possible to manufacture an AT-cut quartz crystal substrate 2 from a Z-cut quartz crystal wafer 200, or it is possible to manufacture an NY-cut quartz crystal substrate 2 or a GT-cut quartz crystal substrate 2 from the AT-cut quartz crystal wafer 200.

The NY cut means a cutting angle used when carving out an object from a plane obtained by rotating a plane perpendicular to the Y axis around the Z axis as much as about 7° through 14°40', and further rotating the plane around the new X axis having been rotated as much as about 34° through 35°10'. By using the NY-cut quartz crystal substrate 2, it is possible to exert a flat frequency-temperature characteristic at a high-temperature side of the room temperature. Further, the GT cut means a cutting angle used when carving out an object from a plane obtained by rotating a plane perpendicular to the Y axis around the X axis as much as about 51.5°, and further rotating the plane around the new X axis having been rotated as much as about 45°. By using the GT-cut quartz crystal substrate 2, there is obtained the resonator element 1 having a more excellent frequency-temperature characteristic, and having excellent vibration characteristics.

Further, although the quartz crystal substrate 2 is formed in the order of the first resist film formation step S2, the first etching step S3, the second resist film formation step S4, and the second etching step S5 in the manufacturing method described above, this is not a limitation. For example, it is possible to adopt the order of the second resist film formation step S4, the second etching step S5, the first resist film formation step S2, and the first etching step S3, or it is also possible to adopt the order of the first resist film formation step S2, the second resist film formation step S4, the first etching step S3, and the second etching step S5. Further, it is possible to perform the first resist film formation step S2 and the second resist film formation step S4 at the same time, and then perform the first etching step S3 and the second etching step S5 at the same time. Further, although the outline shape of the quartz crystal substrate 2 is formed together with the first recessed part 23 and the second recessed part 24 in the first resist film formation step S2 through the second etching step S5 in the manufacturing method described above, this is not a limitation, and it is possible to perform the formation of the outline shape of the quartz crystal substrate 2 in a separate step from these steps.

The method of manufacturing the resonator element 1 is hereinabove described. As described above, the method of manufacturing the quartz crystal substrate 2 included therein includes the preparation step S1 as the step of preparing the quartz crystal wafer 200 which has the AT cut as a predetermined cutting angle with respect to the crystal axes of the quartz crystal, and which has the upper surface 210 as the first surface and the lower surface 220 as the second surface wherein the first surface and the second surface are in the obverse-reverse relationship, the first resist film formation step S2 as the step of forming the first resist film 510 on the upper surface 210 wherein the first resist film 510 has the first tilted parts 513 tilted with respect to the upper surface 210 and is dry-etched together with the quartz crystal, the first etching step S3 as the step of dry-etching the quartz crystal wafer 200 from the upper surface 210 side to form the first tilted surfaces 232 tilted with respect to the upper surface 210, the second resist film formation step S4 as the step of forming the second resist film 520 on the lower surface 220 wherein the second resist film 520 has the second tilted parts 523 tilted with respect to the lower surface 220 and is dry-etched together with the quartz crystal and the second etching step S5 as the step of dry-etching the quartz crystal wafer 200 from the lower surface 220 side to form the second tilted surfaces 242 tilted with respect to the lower surface 220, and forms the quartz crystal substrates 2 which are each provided with the first tilted surface 232 and the second tilted surface 242, and each have the SC cut as the cutting angle different from the AT cut as the predetermined cutting angle.

According to such a method of manufacturing the quartz crystal substrate 2, it is possible to manufacture the SC-cut quartz crystal substrate 2 from the AT-cut quartz crystal wafer 200. Therefore, there is no need to separately carve out the SC-cut quartz crystal wafer from the artificial quartz crystal in order to form the SC-cut quartz crystal substrate 2. Therefore, the manufacturing process of the quartz crystal substrate 2 can be simplified. In particular, when carving out the quartz crystal wafer of the double-rotation cut such as the SC cut from the artificial quartz crystal, it is necessary to prepare the lumbered artificial quartz crystal dedicated thereto. However, according to the method of manufacturing the quartz crystal substrate 2 related to the present embodiment, it becomes unnecessary to prepare the dedicated quartz crystal wafer. Therefore, it is also possible to reduce the manufacturing cost of the quartz crystal substrate 2. In particular, when the demand for the SC-cut quartz crystal resonator element is extremely low compared to the demand for the AT-cut quartz crystal resonator element, significant cost reduction is achieved. Further, it is also possible to reduce the time consumed for preparing the dedicated quartz crystal wafer, and thus, it is possible to shorten the time taken for the manufacture of the quartz crystal substrate 2.

Further, as described above, in the method of manufacturing the quartz crystal substrate 2, the cutting angle of the quartz crystal wafer 200 is the AT cut, and the cutting angle of the quartz crystal substrate 2 is the SC cut, the NY cut, or the GT cut. In particular, in the present embodiment, the cutting angle of the quartz crystal substrate 2 is the SC cut. Thus, the quartz crystal substrate 2 of the SC cut, the NY cut, or the GT cut low in demand can be manufactured from the quartz crystal wafer 200 for manufacturing the AT-cut quartz crystal substrate 2 high in demand. Therefore, it is possible to reduce the manufacturing cost of the quartz crystal substrate 2.

Further, as described above, in the method of manufacturing the quartz crystal substrate 2, the outline shape of the quartz crystal substrate 2 is formed due to the first etching step S3 of forming the first tilted surface 232 and the second etching step S5 of forming the second tilted surface 242. Thus, it becomes unnecessary to additionally perform the step of forming the outline shape of the quartz crystal substrate 2, and thus, it is possible to achieve simplification of the manufacturing process, reduction in manufacturing time, and reduction in manufacturing cost of the quartz crystal substrate 2.

Second Embodiment

Figure 13:
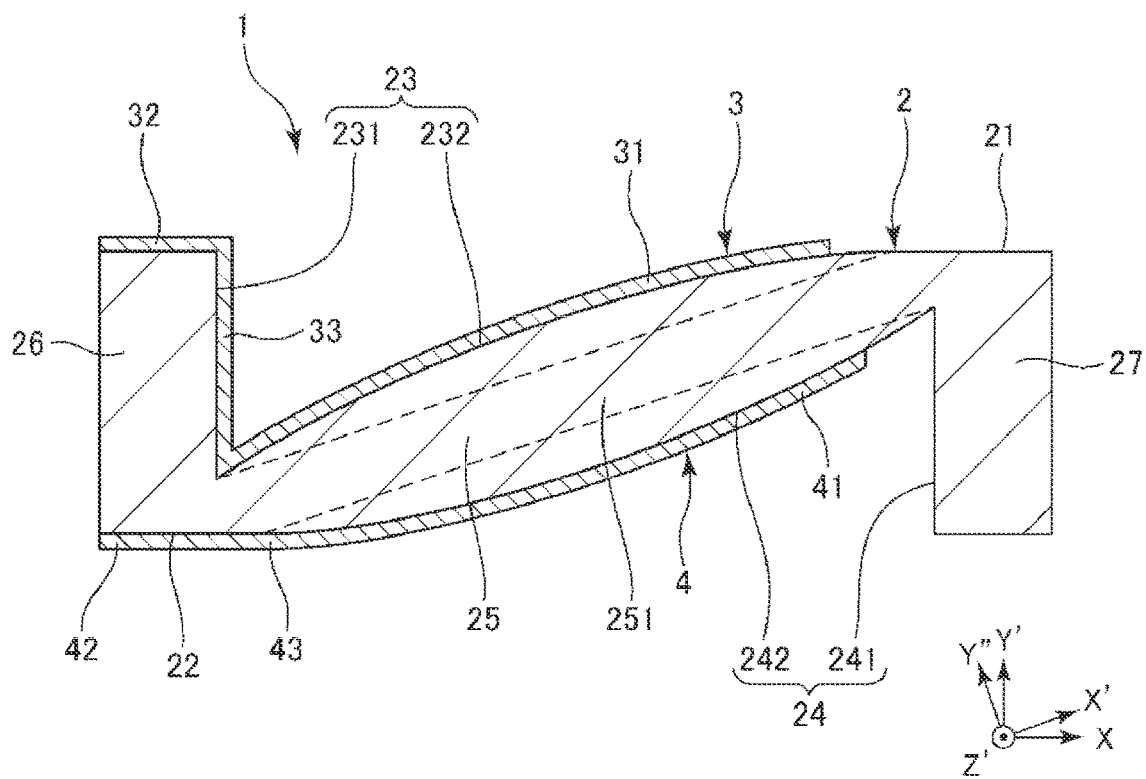
FIG. 13 is a cross-sectional view showing a resonator element according to a second embodiment of the present disclosure.

FIG. 13 is a cross-sectional view showing a resonator element according to a second embodiment of the present disclosure. FIG. 14 through FIG. 17 are cross-sectional views for explaining a method of manufacturing the resonator element.

The method of manufacturing the resonator element 1 according to the present embodiment is substantially the same as the method of manufacturing the resonator element 1 according to the first embodiment described above except the point that the shape of the quartz crystal substrate 2 is different. It should be noted that in the following description, the method of manufacturing the resonator element 1 according to the second embodiment will be described with a focus on the difference from the first embodiment described above, and the description of substantially the same issues will be omitted. Further, in FIG. 13 through FIG. 17, the constituents substantially the same as those of the embodiment described above are denoted by the same reference symbols.

As shown in FIG. 13, in the resonator element 1 in the present embodiment, the first tilted surface 232 of the quartz crystal substrate 2 is formed of a convexly curved surface curved so as to have a convex shape. Similarly, the second tilted surface 242 is formed of a convexly curved surface curved so as to have a convex shape. In other words, the base part 25 of the quartz crystal substrate 2 has a convex shape with the both surfaces each formed of a convexly curved surface. Thus, the vibration caused in the vibrating section 251 can effectively be confined in the vibrating section 251. Therefore, the vibration leakage of the resonator element 1 can be prevented.

The manufacturing process of the resonator element 1 according to the present embodiment is substantially the same as in the first embodiment described above, and includes the preparation step S1, the first resist film formation step S2, the first etching step S3, the second resist film formation step S4, the second etching step S5, the electrode formation step S6, and the segmentalization step S7. Among these, the steps other than the first resist film formation step S2 through the second etching step S5 are substantially the same as in the first embodiment described above. Therefore, only the first resist film formation step S2 through the second etching step S5 will hereinafter be described. Further, in the first resist film formation step S2 through the second etching step S5, the description of substantially the same portions as in the first embodiment described above will be omitted.

First Resist Film Formation Step S2

Figure 14:
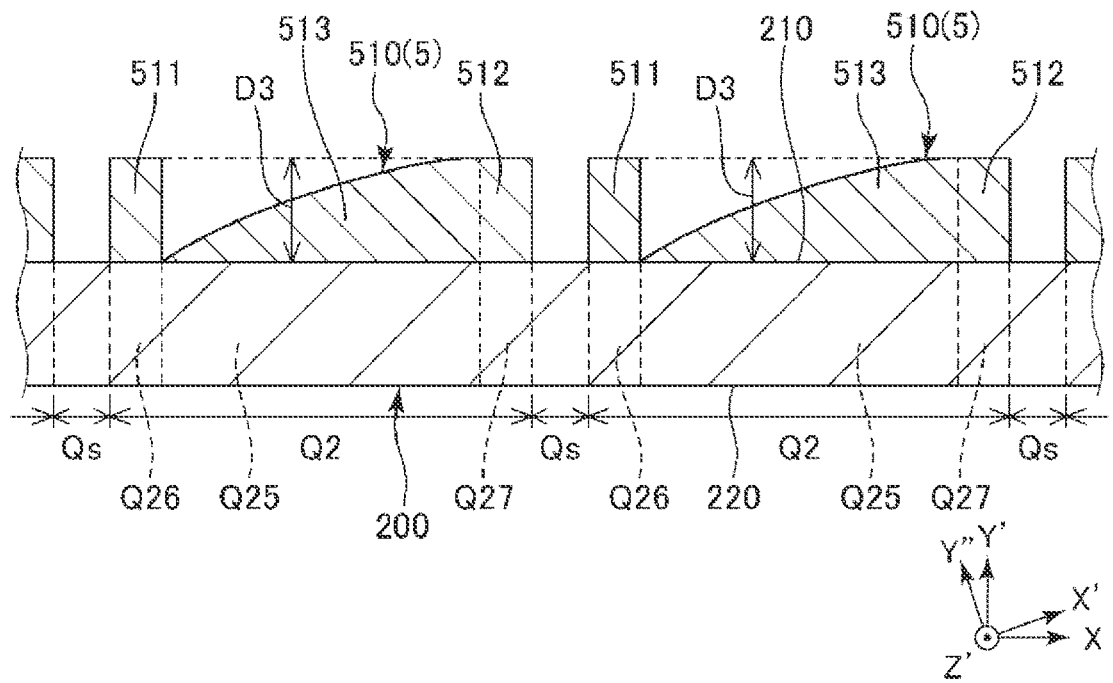
FIG. 14 is a cross-sectional view for explaining a method of manufacturing the resonator element.

First, as shown in FIG. 14, using substantially the same method as in the first embodiment described above, the first resist film 510 is formed on the upper surface 210 of the quartz crystal wafer 200. The first tilted part 513 as a part in the first resist film 510 overlapping the base part area Q25 is tilted as much as about 22° through 24° around the Z' axis with respect to the upper surface 210, and the surface of the first tilted part 513 is curved so as to have a convex shape. Further, the thickness of the first tilted part 513 gradually increases from 0 (zero) to D3 in the direction from the first protruding part area Q26 toward the second protruding part area Q27.

First Etching Step S3

Figure 15:
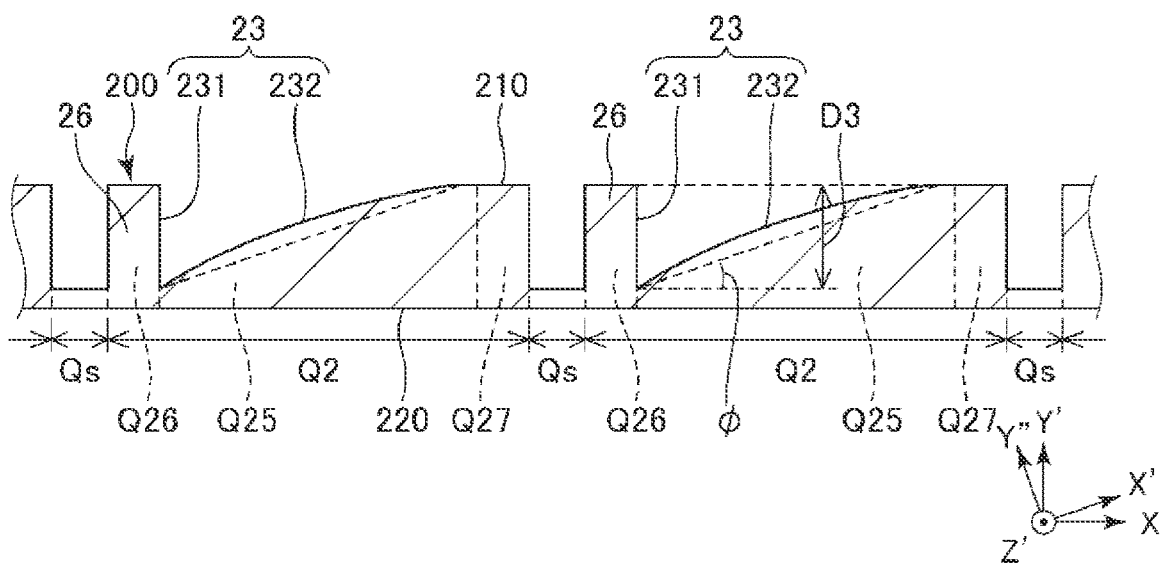
FIG. 15 is a cross-sectional view for explaining the method of manufacturing the resonator element.

Then, the quartz crystal wafer 200 is dry-etched from the upper surface 210 side via the first resist film 510 to transfer the shape of the first resist film 510 to the upper surface 210. As shown in FIG. 15, the dry etching ends when the etching depth from the upper surface 210 reaches D3. Thus, the first recessed part 23 including the first tilted surface 232 having a convex shape is formed at the upper surface 210 side of each of the element areas Q2, and at the same time, a part of the outline shape of the quartz crystal substrate 2 is formed.

Second Resist Film Formation Step S4

Figure 16:
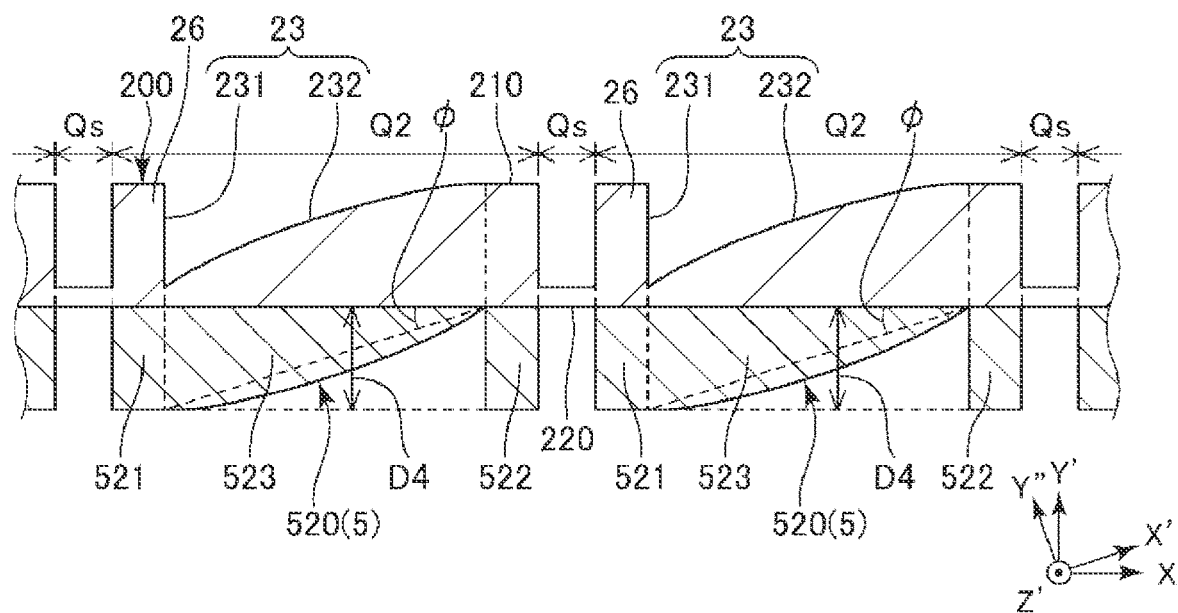
FIG. 16 is a cross-sectional view for explaining the method of manufacturing the resonator element.

First, as shown in FIG. 16, using substantially the same method as in the first embodiment described above, the second resist film 520 is formed on the lower surface 220 of the quartz crystal wafer 200. The second tilted part 523 as a part in the second resist film 520 overlapping the base part area Q25 is tilted as much as about 22° through 24° around the Z' axis with respect to the lower surface 220, and the surface of the second tilted part 523 is curved so as to have a convex shape. Further, the thickness of the second tilted part 523 gradually increases from 0 (zero) to D4 in the direction from the second protruding part area Q27 toward the first protruding part area Q26.

Second Etching Step S5

Figure 17:
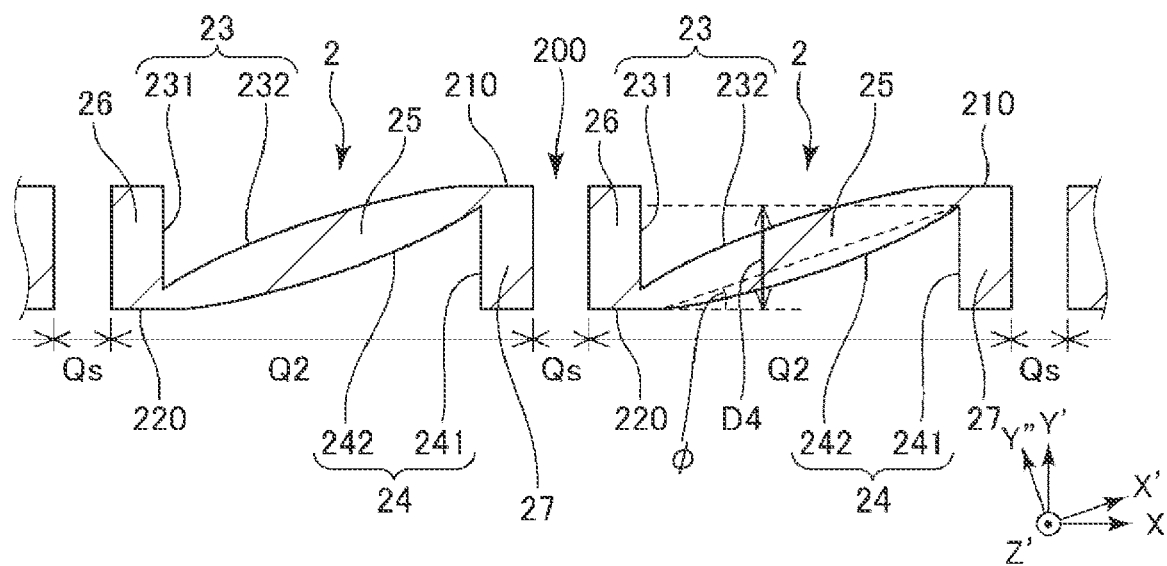
FIG. 17 is a cross-sectional view for explaining the method of manufacturing the resonator element.

Then, the quartz crystal wafer 200 is dry-etched from the lower surface 220 side via the second resist film 520 to transfer the shape of the second resist film 520 to the lower surface 220. As shown in FIG. 17, the dry etching ends when the etching depth from the lower surface 220 reaches D4. Thus, the second recessed part 24 including the second tilted surface 242 having a convex shape is formed at the lower surface 220 side of each of the element areas Q2, and at the same time, the outline shape of the quartz crystal substrate 2 is formed.

According to such a manufacturing method as described hereinabove, there is obtained the quartz crystal substrate 2 in which the first tilted surface 232 and the second tilted surface 242 are each convexly curved to have a convex shape. Thus, the vibration caused in the vibrating section 251 can effectively be confined in the vibrating section 251. Therefore, the vibration leakage of the resonator element 1 can effectively be prevented.

As described hereinabove, in the present embodiment, the first tilted part 513 and the second tilted part 523 are each curved convexly. Thus, the shapes of the first tilted part 513 and the second tilted part 523 are respectively transferred to the first tilted surface 232 and the second tilted surface 242 of the quartz crystal substrate 2, and thus, the quartz crystal substrate 2 having the convex shape can be obtained. Therefore, there is obtained the resonator element 1 in which the vibration leakage is prevented, and which has the excellent vibration characteristics.

According also to such a second embodiment as described above, there can be exerted substantially the same advantages as in the first embodiment described above. It should be noted that although both of the first tilted surface 232 and the second tilted surface 242 are formed of the convexly curved surfaces in the present embodiment, this is not a limitation, and either one thereof can be formed of a flat surface.

Third Embodiment

Figure 18:
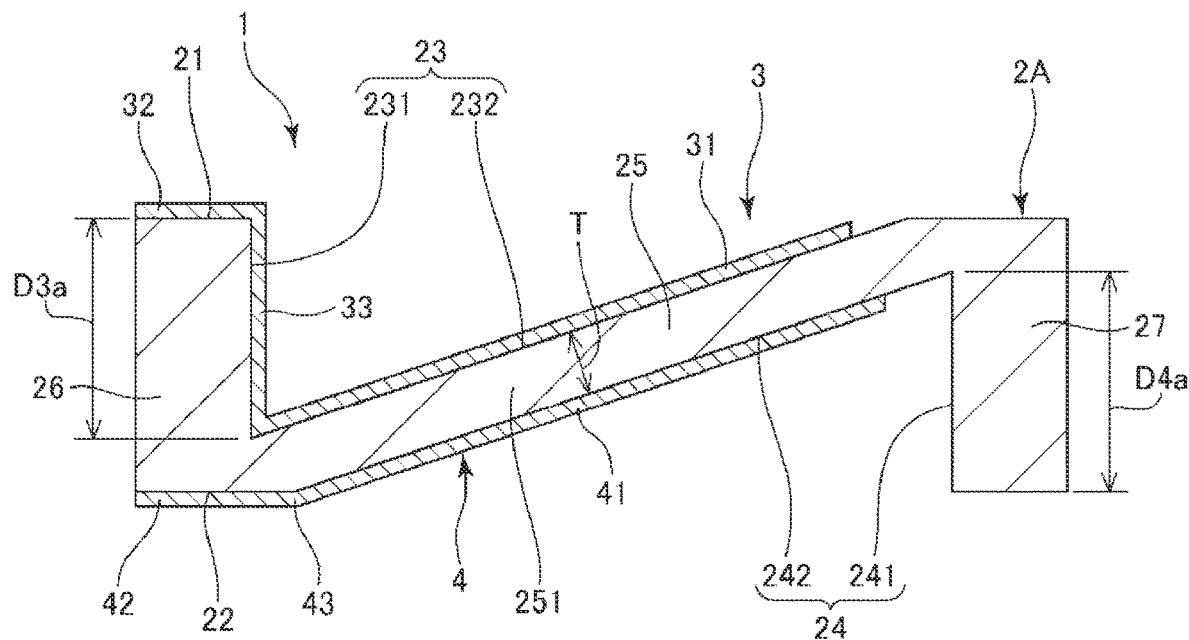
FIG. 18 is a cross-sectional view showing resonator elements according to a third embodiment of the present disclosure.
Figure 18:
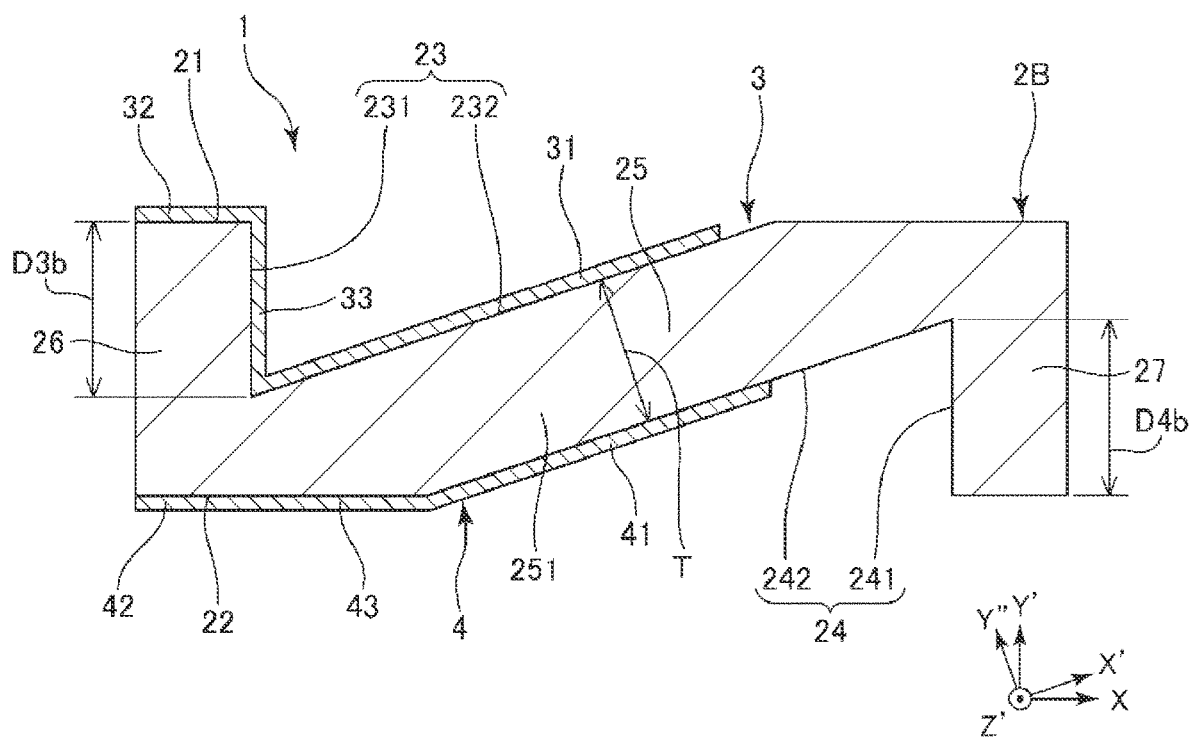

FIG. 18 is a cross-sectional view showing resonator elements according to a third embodiment of the present disclosure. FIG. 19 through FIG. 22 are cross-sectional views for explaining a method of manufacturing the resonator elements.

The method of manufacturing the resonator elements 1 according to the present embodiment is substantially the same as the method of manufacturing the resonator element 1 according to the first embodiment described above except the point that a plurality of types of quartz crystal substrates 2 different in thickness from each other are manufactured from the single quartz crystal wafer 200. It should be noted that in the following description, the method of manufacturing the resonator elements 1 according to the third embodiment will be described with a focus on the difference from the first embodiment described above, and the description of substantially the same issues will be omitted. Further, in FIG. 19 through FIG. 22, the constituents substantially the same as those of the embodiment described above are denoted by the same reference symbols.

In the method of manufacturing the resonator elements 1 according to the present embodiment, as shown in FIG. 18, two types of quartz crystal substrates 2A, 2B different in thickness T of the base part 25 from each other are formed at the same time from the single quartz crystal wafer 200. Thus, it is possible to form the plurality of types of quartz crystal substrates 2 at a time, and thus, there is obtained the manufacturing method having an excellent convenience. Further, it is possible to suppress excessive production of the quartz crystal substrate 2 of a single species, and thus, it is possible to suppress an increase in stock. It should be noted that since the oscillation frequency of the resonator element 1 is controlled by the thickness T, in the present embodiment, it becomes possible to form the SC-cut quartz crystal substrates 2A, 2B different in oscillation frequency from each other at the same time.

It should be noted that hereinafter, a maximum depth of the first recessed part 23 of the quartz crystal substrate 2A is denoted by D3$a$, and a maximum depth of the first recessed part 23 of the quartz crystal substrate 2B is denoted by D3$b$. Further, a maximum depth of the second recessed part 24 of the quartz crystal substrate 2A is denoted by D4$a$, and a maximum depth of the second recessed part 24 of the quartz crystal substrate 2B is denoted by D4$b$. In the present embodiment, D3$a$=D4$a$>D3$b$=D4$b$ is true.

Similarly to the first embodiment described above, the manufacturing process of the resonator elements 1 according to the present embodiment includes the preparation step S1, the first resist film formation step S2, the first etching step S3, the second resist film formation step S4, the second etching step S5, the electrode formation step S6, and the segmentalization step S7. Among these, the steps other than the first resist film formation step S2 through the second etching step S5 are substantially the same as in the first embodiment described above. Therefore, only the first resist film formation step S2 through the second etching step S5 will hereinafter be described. Further, in the first resist film formation step S2 through the second etching step S5, the description of substantially the same portions as in the first embodiment described above will be omitted.

First Resist Film Formation Step S2

Figure 19:
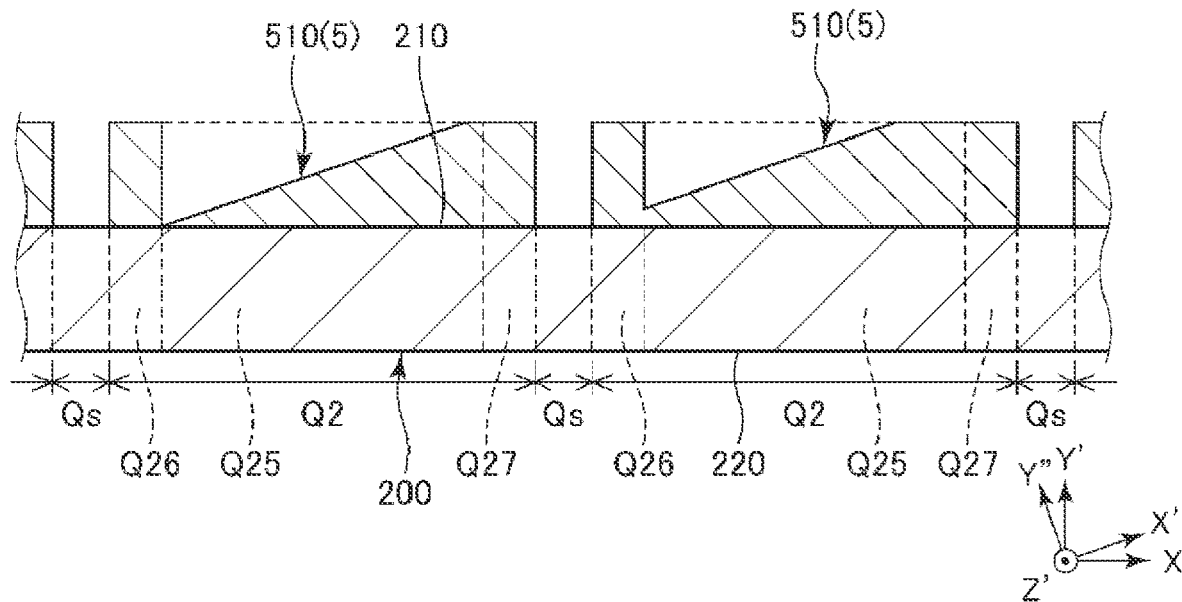
FIG. 19 is a cross-sectional view for explaining a method of manufacturing the resonator elements.

First, as shown in FIG. 19, using substantially the same method as in the first embodiment described above, the first resist film 510 is formed on the upper surface 210 of the quartz crystal wafer 200. The shape of the first resist film 510 is designed so that the first recessed parts 23 of the respective quartz crystal substrates 2A and the first recessed parts 23 of the respective quartz crystal substrates 2B are formed at the same time in the subsequent first etching step S3.

First Etching Step S3

Figure 20:
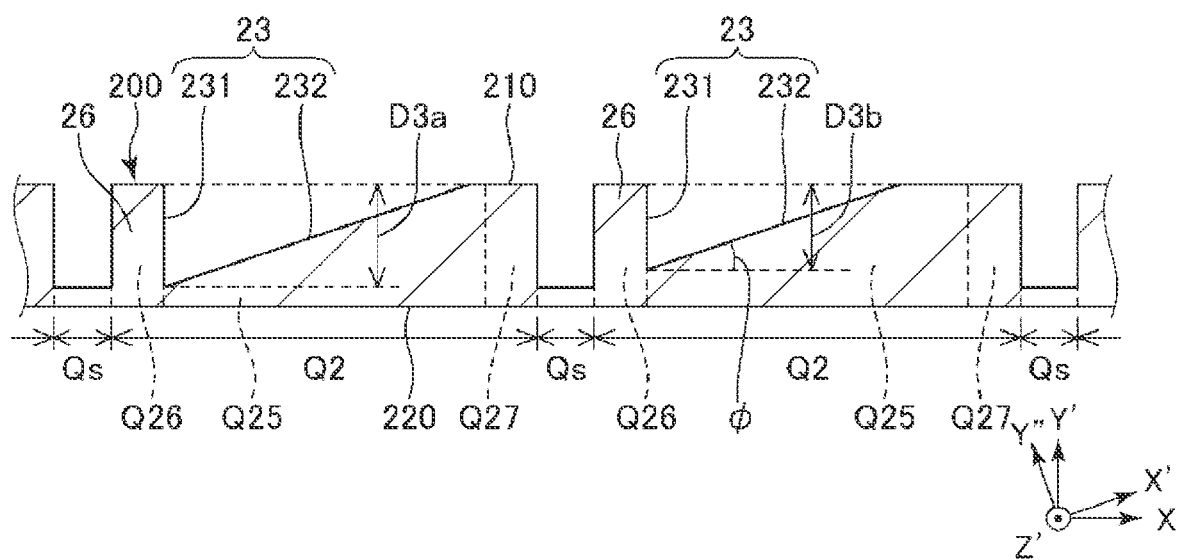
FIG. 20 is a cross-sectional view for explaining the method of manufacturing the resonator elements.

Then, the quartz crystal wafer 200 is dry-etched from the upper surface 210 side via the first resist film 510 to transfer the shape of the first resist film 510 to the upper surface 210. As shown in FIG. 20, the dry etching ends when the etching depth in the element area Q2 forming the quartz crystal substrate 2A reaches D3$a$, and the etching depth in the element area Q2 forming the quartz crystal substrate 2B reaches D3$b$.

Second Resist Film Formation Step S4

Figure 21:
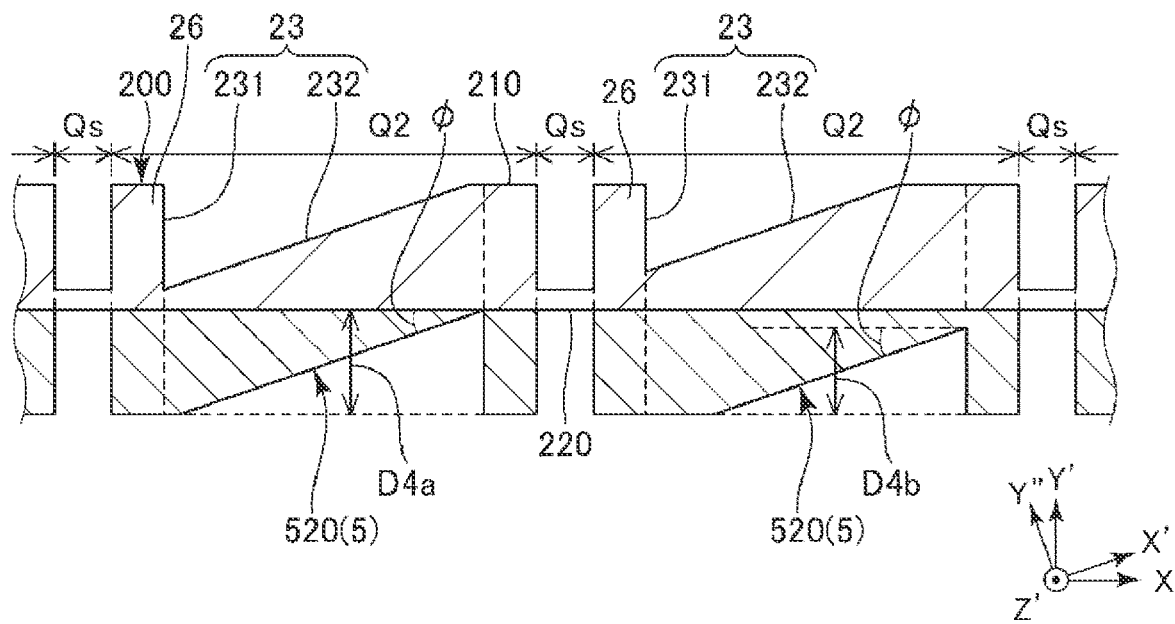
FIG. 21 is a cross-sectional view for explaining the method of manufacturing the resonator elements.

First, as shown in FIG. 21, using substantially the same method as in the first embodiment described above, the second resist film 520 is formed on the lower surface 220 of the quartz crystal wafer 200. The shape of the second resist film 520 is designed so that the second recessed parts 24 of the respective quartz crystal substrates 2A and the second recessed parts 24 of the respective quartz crystal substrates 2B are formed at the same time in the subsequent second etching step S5.

Second Etching Step S5

Figure 22:
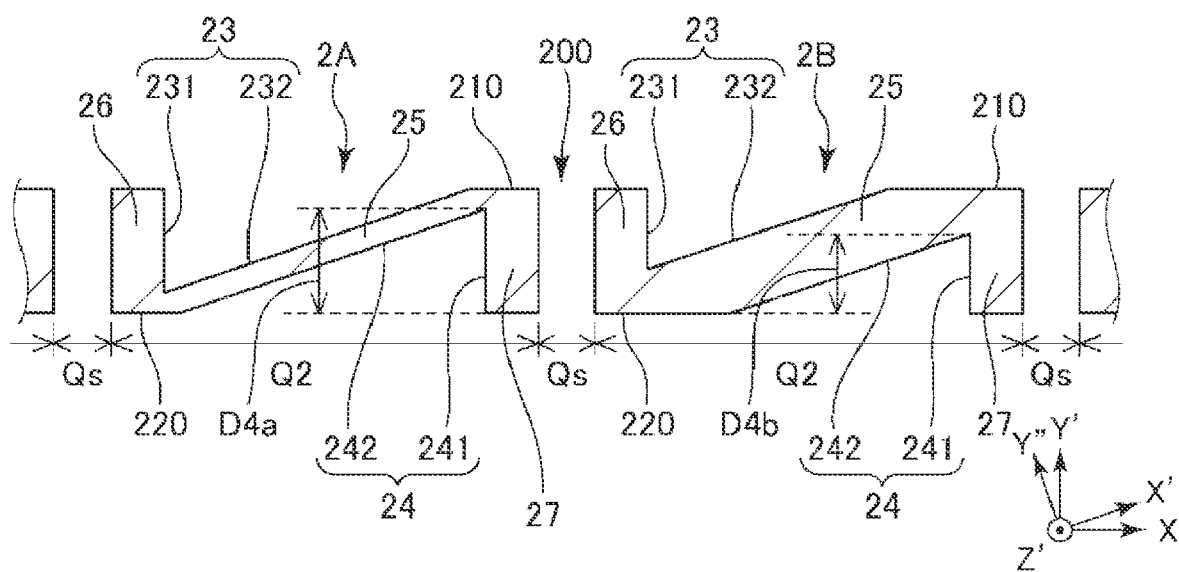
FIG. 22 is a cross-sectional view for explaining the method of manufacturing the resonator elements.

Then, the quartz crystal wafer 200 is dry-etched from the lower surface 220 side via the second resist film 520 to transfer the shape of the second resist film 520 to the lower surface 220. As shown in FIG. 22, the dry etching ends when the etching depth in the element area Q2 forming the quartz crystal substrate 2A reaches D4$a$, and the etching depth in the element area Q2 forming the quartz crystal substrate 2B reaches D4$b$. Thus, the two types of quartz crystal substrates 2 different in thickness T from each other are formed at the same time from the single quartz crystal wafer 200.

As described hereinabove, in the method of manufacturing the quartz crystal substrates 2 according to the present embodiment, the quartz crystal wafer 200 has the plurality of element areas Q2 where the quartz crystal substrates 2 are formed, and the thickness T of the quartz crystal substrate 2A formed from at least one of the element areas Q2 is different from the thickness T of the quartz crystal substrate 2B formed from another of the element areas Q2. According to such a manufacturing method, it is possible to manufacture the plurality of types of quartz crystal substrates 2 at the same time from the single quartz crystal wafer 200. Therefore, there is obtained the method of manufacturing the quartz crystal substrates 2 high in convenience. Further, it is possible to suppress excessive production of the quartz crystal substrate 2 of a single species, and thus, it is possible to suppress an increase in stock.

According also to such a third embodiment as described hereinabove, there can be exerted substantially the same advantages as in the first embodiment described above. It should be noted that although the two types of quartz crystal substrates 2A, 2B different in thickness of the base part 25 from each other are manufactured from the single quartz crystal wafer 200 in the present embodiment, this is not a limitation, and it is possible to manufacture three or more types of quartz crystal substrates 2.

Further, although the first recessed parts 23 of the respective quartz crystal substrates 2A and the first recessed parts 23 of the respective quartz crystal substrates 2B are formed at the same time in the first resist film formation step S2 through the first etching step S3, this is not a limitation, and it is possible to, for example, form the first recessed parts 23 of the respective quartz crystal substrates 2A and the first recessed parts 23 of the respective quartz crystal substrates 2B separately from each other. Specifically, it is also possible to include a step of forming the first resist film 510 corresponding to the first recessed parts 23 of the respective quartz crystal substrates 2A, a step of dry-etching the quartz crystal wafer 200 via the first resist film 510 to thereby form the first recessed parts 23 of the respective quartz crystal substrates 2A, a step of forming the first resist film 510 corresponding to the first recessed parts 23 of the respective quartz crystal substrates 2B, and a step of dry-etching the quartz crystal wafer 200 via the first resist film 510 to thereby form the first recessed parts 23 of the respective quartz crystal substrates 2B. The same applies to the second resist film formation step S4 and the second etching step S5.

Fourth Embodiment

Figure 23:
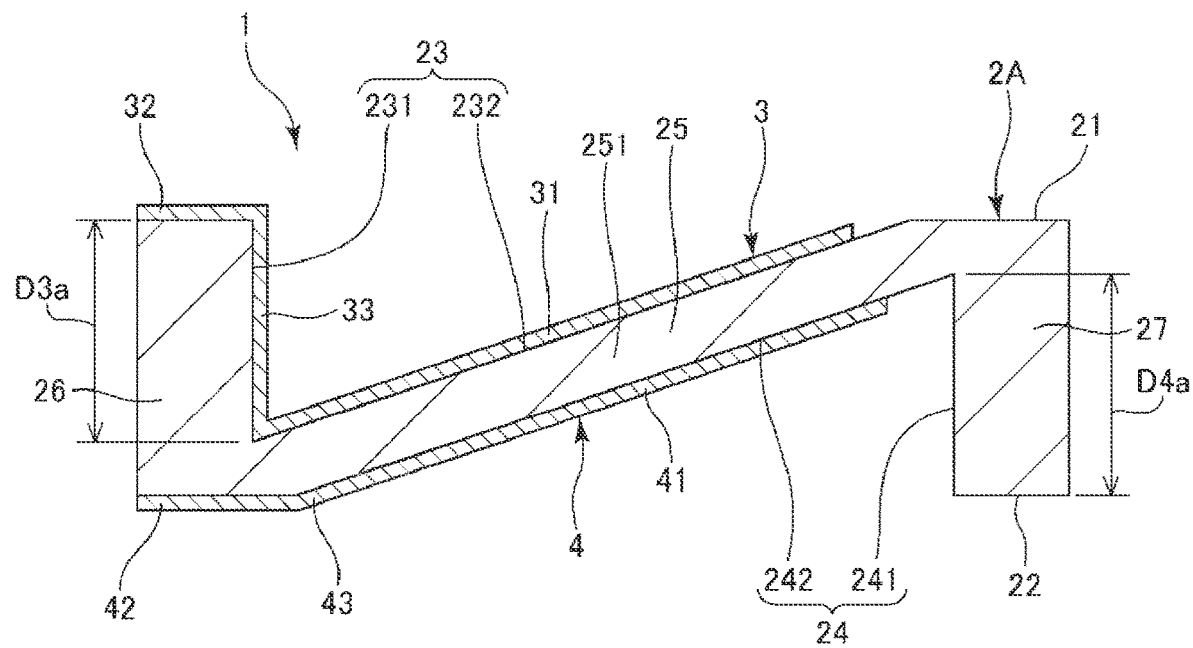
FIG. 23 is a cross-sectional view showing resonator elements according to a fourth embodiment of the present disclosure.
Figure 23:
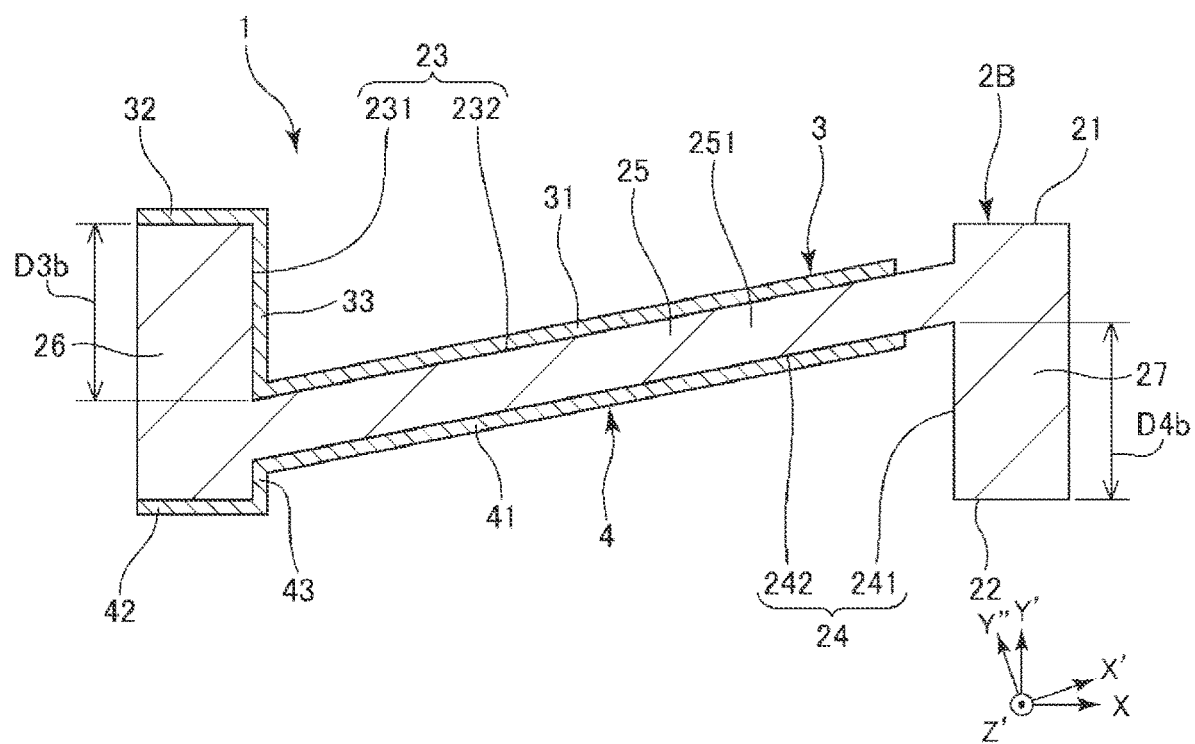

FIG. 23 is a cross-sectional view showing resonator elements according to a fourth embodiment of the present disclosure. FIG. 24 through FIG. 27 are cross-sectional views for explaining a method of manufacturing the resonator elements.

The method of manufacturing the resonator elements 1 according to the present embodiment is substantially the same as the method of manufacturing the resonator element 1 according to the first embodiment described above except the point that a plurality of types of quartz crystal substrates 2 different in cutting angle from each other from the single quartz crystal wafer 200. It should be noted that in the following description, the method of manufacturing the resonator elements 1 according to the fourth embodiment will be described with a focus on the difference from the first embodiment described above, and the description of substantially the same issues will be omitted. Further, in FIG. 23 through FIG. 27, the constituents substantially the same as those of the embodiment described above are denoted by the same reference symbols.

In the method of manufacturing the resonator elements 1 according to the present embodiment, as shown in FIG. 23, the two types of quartz crystal substrates 2A, 2B different in cutting angle of the base part 25 from each other are formed at the same time from the single quartz crystal wafer 200. Thus, it is possible to form the plurality of types of quartz crystal substrates 2 at a time. Therefore, there is obtained the method of manufacturing the quartz crystal substrates 2 high in convenience. Further, it is possible to suppress excessive production of the quartz crystal substrate 2 of a single species, and thus, it is possible to suppress an increase in stock.

It should be noted that hereinafter, a maximum depth of the first recessed part 23 of the quartz crystal substrate 2A is denoted by D3$a$, and a maximum depth of the first recessed part 23 of the quartz crystal substrate 2B is denoted by D3$b$. Further, a maximum depth of the second recessed part 24 of the quartz crystal substrate 2A is denoted by D4$a$, and a maximum depth of the second recessed part 24 of the quartz crystal substrate 2B is denoted by D4$b$. In the present embodiment, D3$a$=D4$a$>D3$b$=D4$b$ is true.

Similarly to the first embodiment described above, the manufacturing process of the resonator elements 1 according to the present embodiment includes the preparation step S1, the first resist film formation step S2, the first etching step S3, the second resist film formation step S4, the second etching step S5, the electrode formation step S6, and the segmentalization step S7. Among these, the steps other than the first resist film formation step S2 through the second etching step S5 are substantially the same as in the first embodiment described above. Therefore, only the first resist film formation step S2 through the second etching step S5 will hereinafter be described. Further, in the first resist film formation step S2 through the second etching step S5, the description of substantially the same portions as in the first embodiment described above will be omitted.

First Resist Film Formation Step S2

Figure 24:
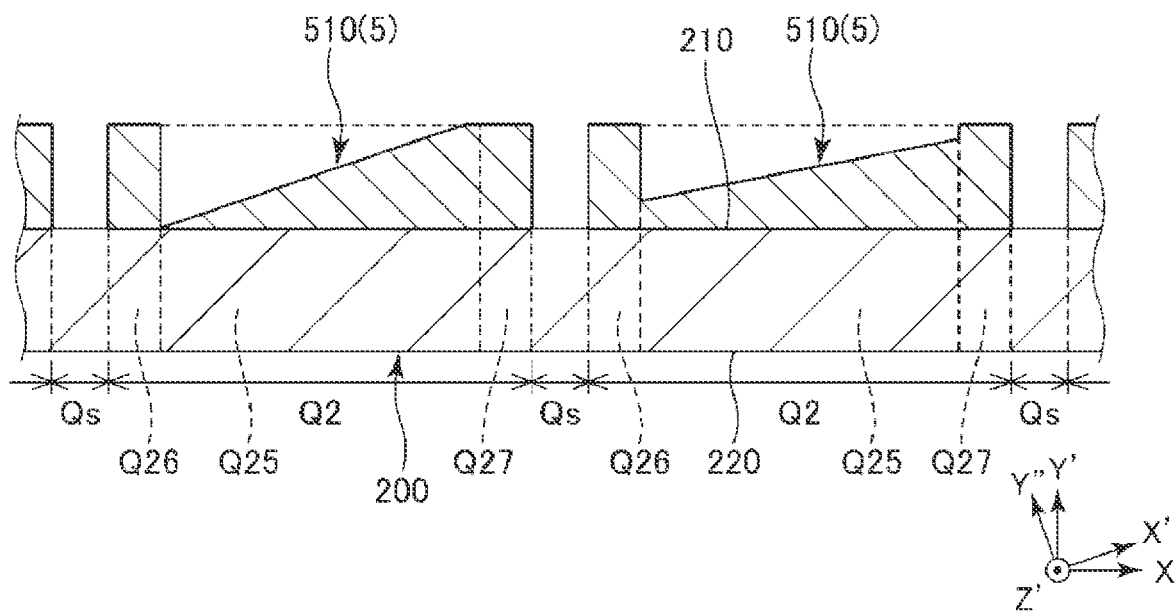
FIG. 24 is a cross-sectional view for explaining a method of manufacturing the resonator elements.

First, as shown in FIG. 24, using substantially the same method as in the first embodiment described above, the first resist film 510 is formed on the upper surface 210 of the quartz crystal wafer 200. The shape of the first resist film 510 is designed so that the first recessed parts 23 of the respective quartz crystal substrates 2A and the first recessed parts 23 of the respective quartz crystal substrates 2B are formed at the same time in the subsequent first etching step S3.

First Etching Step S3

Figure 25:
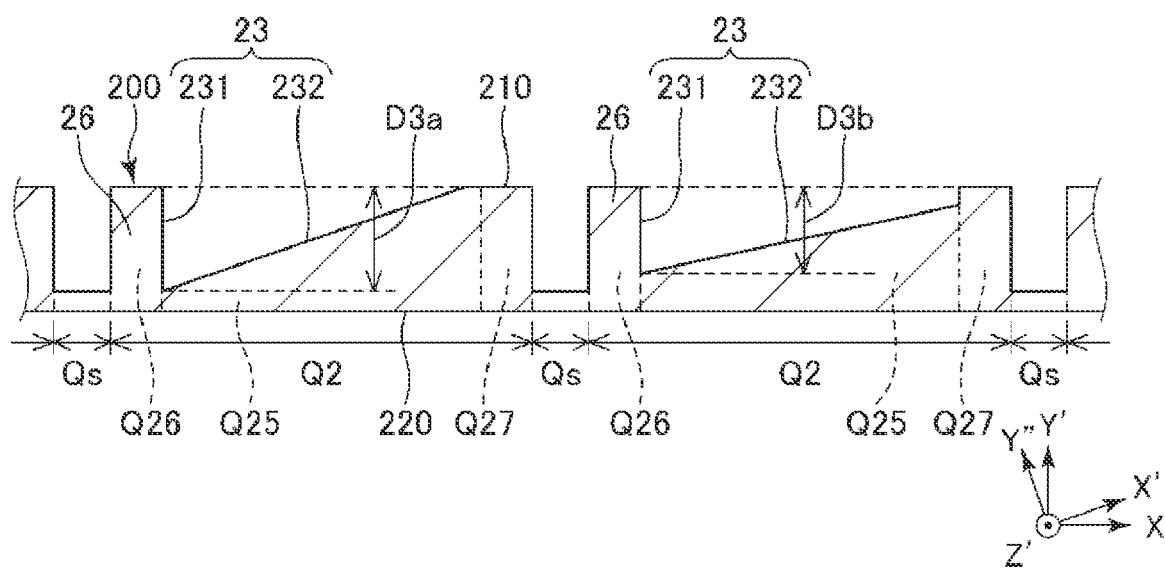
FIG. 25 is a cross-sectional view for explaining the method of manufacturing the resonator elements.

Then, the quartz crystal wafer 200 is dry-etched from the upper surface 210 side via the first resist film 510 to transfer the shape of the first resist film 510 to the upper surface 210. As shown in FIG. 25, the dry etching ends when the etching depth in the element area Q2 forming the quartz crystal substrate 2A reaches D3$a$, and the etching depth in the element area Q2 forming the quartz crystal substrate 2B reaches D3$b$.

Second Resist Film Formation Step S4

Figure 26:
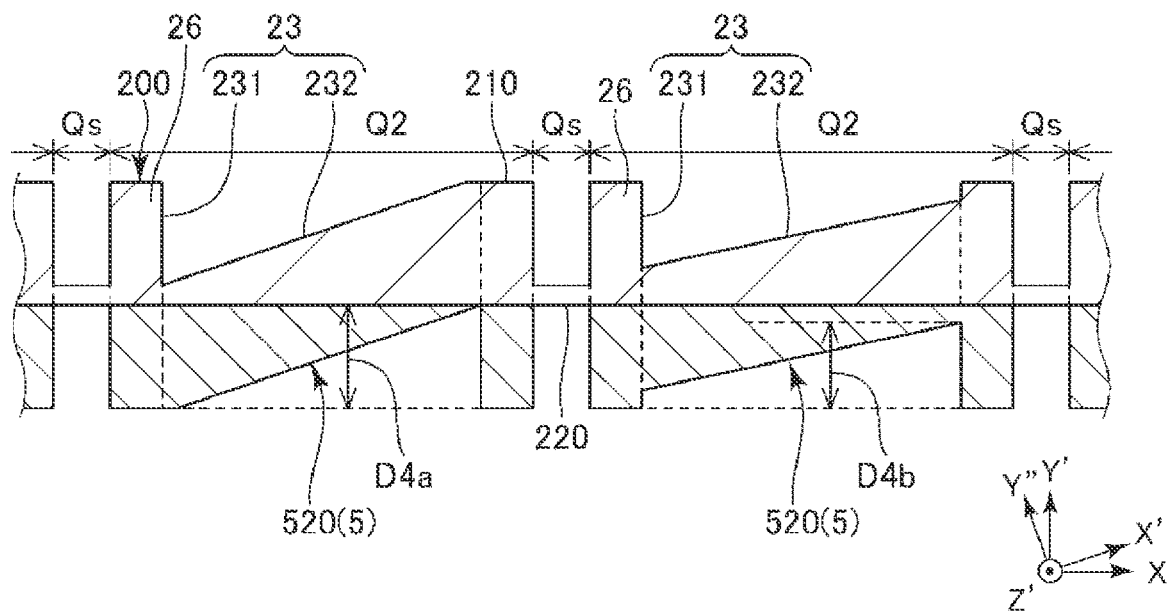
FIG. 26 is a cross-sectional view for explaining the method of manufacturing the resonator elements.

First, as shown in FIG. 26, using substantially the same method as in the first embodiment described above, the second resist film 520 is formed on the lower surface 220 of the quartz crystal wafer 200. The shape of the second resist film 520 is designed so that the second recessed parts 24 of the respective quartz crystal substrates 2A and the second recessed parts 24 of the respective quartz crystal substrates 2B are formed at the same time in the subsequent second etching step S5.

Second Etching Step S5

Figure 27:
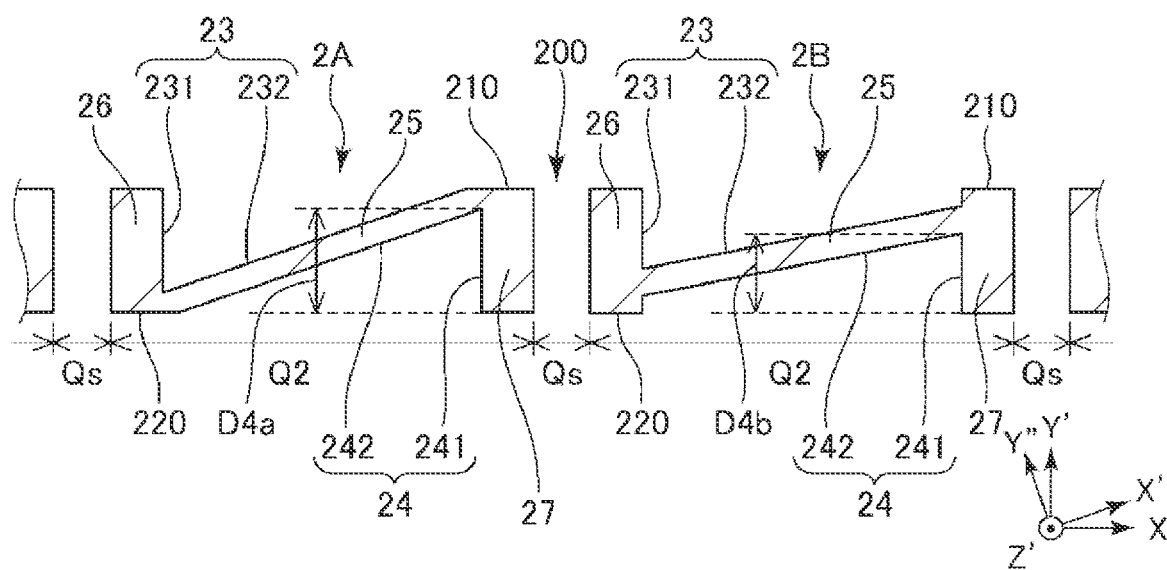
FIG. 27 is a cross-sectional view for explaining the method of manufacturing the resonator elements.

Then, the quartz crystal wafer 200 is dry-etched from the lower surface 220 side via the second resist film 520 to transfer the shape of the second resist film 520 to the lower surface 220. As shown in FIG. 27, the dry etching ends when the etching depth in the element area Q2 forming the quartz crystal substrate 2A reaches D4a, and the etching depth in the element area Q2 forming the quartz crystal substrate 2B reaches D4b. Thus, the two types of quartz crystal substrates 2 different in cutting angle from each other are formed at the same time from the single quartz crystal wafer 200.

As described hereinabove, in the method of manufacturing the quartz crystal substrates 2 according to the present embodiment, the quartz crystal wafer 200 has the plurality of element areas Q2 where the quartz crystal substrates 2 are formed, and the cutting angle of the quartz crystal substrate 2A formed from at least one of the element areas Q2 is different from the cutting angle of the quartz crystal substrate 2B formed from another of the element areas Q2. According to such a manufacturing method, it is possible to manufacture the plurality of types of quartz crystal substrates 2 at the same time from the single quartz crystal wafer 200. Therefore, there is obtained the method of manufacturing the quartz crystal substrates 2 high in convenience. Further, it is possible to suppress excessive production of the quartz crystal substrate 2 of a single species, and thus, it is possible to suppress an increase in stock.

According also to such a fourth embodiment as described hereinabove, there can be exerted substantially the same advantages as in the first embodiment described above. It should be noted that although the two types of quartz crystal substrates 2A, 2B different in cutting angle from each other are manufactured from the single quartz crystal wafer 200 in the present embodiment, this is not a limitation, and it is possible to manufacture three or more types of quartz crystal substrates 2. Further, it is also possible for the plurality of quartz crystal substrates 2 to be different not only in cutting angle but also in thickness from each other.

Further, although the first recessed parts 23 of the respective quartz crystal substrates 2A and the first recessed parts 23 of the respective quartz crystal substrates 2B are formed at the same time in the first resist film formation step S2 through the first etching step S3, this is not a limitation, and it is possible to, for example, form the first recessed parts 23 of the respective quartz crystal substrates 2A and the first recessed parts 23 of the respective quartz crystal substrates 2B separately from each other. Specifically, it is also possible to include a step of forming the first resist film 510 corresponding to the first recessed parts 23 of the respective quartz crystal substrates 2A, a step of dry-etching the quartz crystal wafer 200 via the first resist film 510 to thereby form the first recessed parts 23 of the respective quartz crystal substrates 2A, a step of forming the first resist film 510 corresponding to the first recessed parts 23 of the respective quartz crystal substrates 2B, and a step of dry-etching the quartz crystal wafer 200 via the first resist film 510 to thereby form the first recessed parts 23 of the respective quartz crystal substrates 2B. The same applies to the second resist film formation step S4 and the second etching step S5.

Fifth Embodiment

Figure 28:
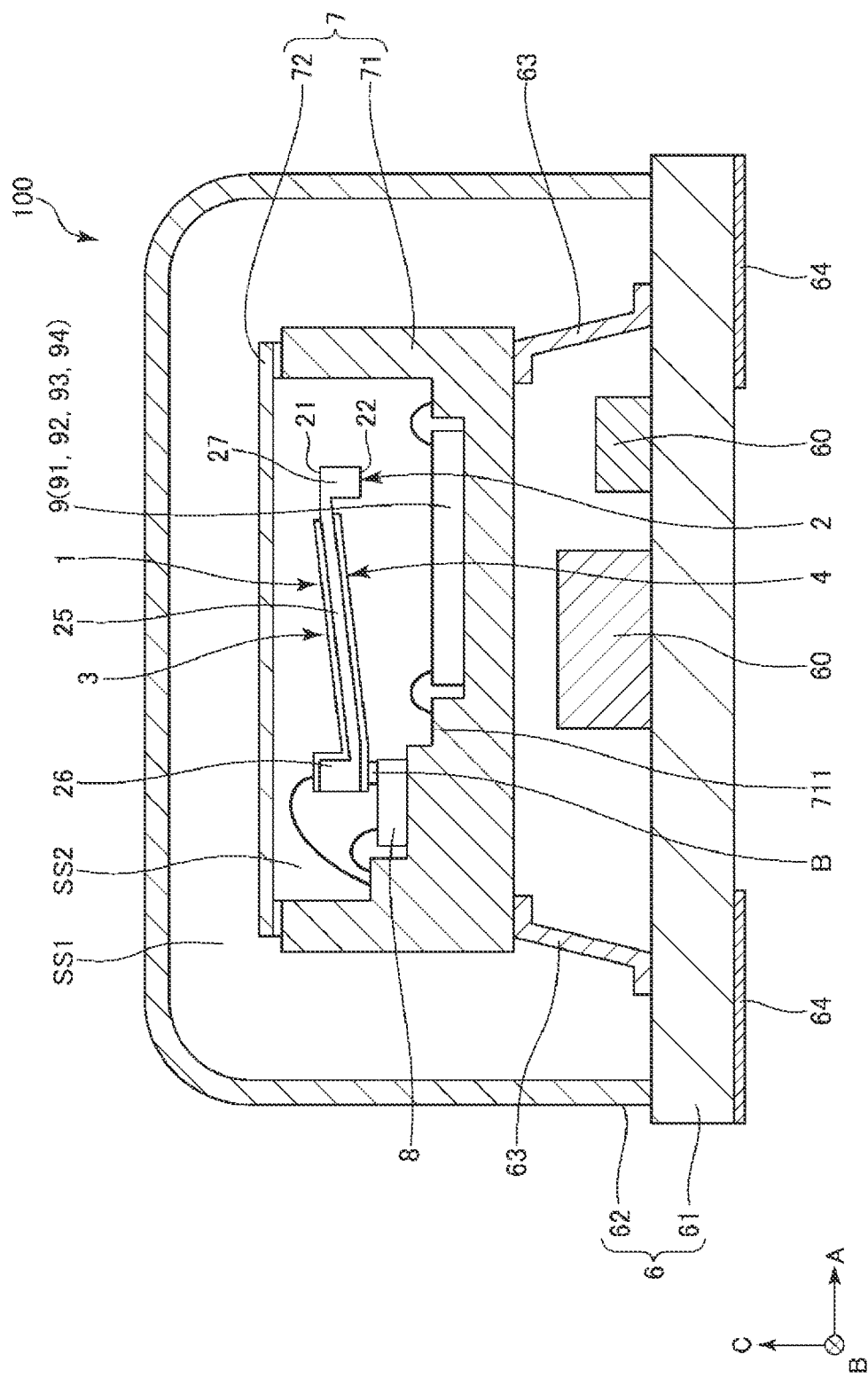
FIG. 28 is a cross-sectional view showing an oscillator according to a fifth embodiment of the present disclosure.

FIG. 28 is a cross-sectional view showing an oscillator related to a fifth embodiment of the present disclosure.

A thermostatic bath type oscillator 100 shown in FIG. 28 has an outer package 6, an inner package 7 housed in the outer package 6, the resonator element 1 housed in the inner package 7, a heater element 8, and an integrated circuit element 9. The resonator element 1, the heater element 8, and the integrated circuit element 9 are electrically coupled to each other with interconnections or the like not shown formed in the inner package 7. Further, the integrated circuit element 9 has a temperature sensor 91, an oscillation circuit 92, a temperature compensation circuit 93, and a temperature control circuit 94.

The outer package 6 has a mounting board 61 and a lid 62 bonded to an upper surface of the mounting board 61. Inside the outer package 6, there is formed a housing space SS1 airtightly sealed, and the inner package 7 is housed in the housing space SS1. The housing space SS1 is in a reduced-pressure state, and preferably a state approximate to a vacuum state. Thus, it is possible to exert an excellent heat insulating property, and it becomes difficult for the heat outside the oscillator 100 to be transferred to the resonator element 1. It should be noted that the atmosphere in the housing space SS1 is not particularly limited.

The inner package 7 is mounted on the mounting board 61 via a lead frame 63. Further, the inner package 7 is electrically coupled to the mounting board 61 via the lead frame 63. Further, on a lower surface of the mounting board 61, there are disposed mounting terminals 64 which are electrically coupled to the inner package 7 via the lead frame 63, and which is configured to mount the oscillator 100 on a circuit board or the like. Further, in the housing space SS1, there are housed circuit components 60 such as a circuit element, a plurality of capacitors, and a resistor in a state of being fixed to the upper surface of the mounting board 61. The circuit components 60 can be disposed as a part of the integrated circuit element 9, or can also be those constituting a separate circuit from the integrated circuit element 9.

Further, the inner package 7 has a base substrate 71 having a recessed part 711 opening upward, and a lid 72 bonded to an upper surface of the base substrate 71 so as to block the opening of the recessed part 711. Inside the inner package 7, there is formed a housing space SS2 airtightly sealed, and the resonator element 1, the heater element 8, and the integrated circuit element 9 are housed in the housing space SS2. The housing space SS2 is in a reduced-pressure state, and preferably a state approximate to a vacuum state. Thus, it is possible to exert an excellent heat insulating property, and it becomes difficult for the outside heat to be transferred to the resonator element 1. It should be noted that the atmosphere in the housing space SS2 is not particularly limited.

Further, the heater element 8 and the integrated circuit element 9 are fixed to the recessed part 711, and the resonator element 1 is fixed to an upper surface of the heater element 8 via a bonding member B having electrical conductivity. The resonator element 1 is disposed in a posture in which the lower surface 22 faces to the heater element 8, and the lower surface 22 of the first protruding part 26 is fixed to the upper surface of the heating element 8 via the bonding member B.

The integrated circuit element 9 has the temperature sensor 91, the oscillation circuit 92, the temperature compensation circuit 93, and the temperature control circuit 94. The oscillation circuit 92 is electrically coupled to the resonator element 1, and oscillates the resonator element 1 by amplifying an output signal of the resonator element 1 and then feeding back the signal thus amplified to the resonator element 1. The temperature compensation circuit 93 performs temperature compensation based on temperature information output from the temperature sensor 91 so that a frequency variation of the output signal becomes smaller than the frequency-temperature characteristic of the resonator element 1 itself. The temperature control circuit 94 controls an amount of the electric current flowing through a resistor of the heater element 8 based on an output signal of the temperature sensor 91 to keep the temperature of the resonator element 1 constant.

Such an oscillator 100 can be installed in, for example, a smartphone, a personal computer, a digital still camera, a tablet terminal, a timepiece, a smart watch, an inkjet printer, a television set, a wearable terminal such as a pair of smart glasses or an HMD (head-mounted display), a video camera, a video cassette recorder, a car navigation system, a drive recorder, a personal digital assistance, an electronic dictionary, an electronic translator, an electronic calculator, a computerized game machine, a toy, a word processor, a workstation, a video phone, a security video monitor, electronic binoculars, a POS terminal, medical equipment, a fish finder, a variety of measurement instruments, equipment for a mobile terminal base station, a variety of gauges for a vehicle, a railroad wheel, an airplane, a helicopter, a ship, or a boat, a variety of types of electronic equipment such as a flight simulator or a network server, a variety of vehicles such as a car, a robot, a drone, a motorcycle, an airplane, a ship, a boat, an electric train, a rocket, or a space ship.

Although the method of manufacturing the quartz crystal element according to the present disclosure is hereinabove described based on the illustrated embodiments, the present disclosure is not limited to the embodiments, but the constituents of each of the sections can be replaced with those having substantially the same function and an arbitrary configuration. Further, the present disclosure can also be added with any other constituents. Further, the present disclosure can be a combination of any two or more configurations of the embodiments described above.

Further, the quartz crystal substrates 2 used for the resonator element 1 are explained as representatives of the quartz crystal element in the embodiments described above, but this is not a limitation. For example, the quartz crystal element can be an optical element such as a lens.

What is claimed is:

1. A method of manufacturing a quartz crystal element, the method comprising:
   preparing a quartz crystal wafer which has a predetermined cutting angle with respect to a crystal axis of a quartz crystal, and which has a first surface and a second surface having an obverse-reverse relationship;
   forming a first resist film on the first surface, the first resist film having a first tilted part tilted with respect to the first surface, and being dry-etched together with the quartz crystal;
   forming a first tilted surface tilted with respect to the first surface by dry-etching the quartz crystal wafer from the first surface;
   forming a second resist film on the second surface, the second resist film having a second tilted part tilted with respect to the second surface, and being dry-etched together with the quartz crystal; and
   forming a second tilted surface tilted with respect to the second surface by dry-etching the quartz crystal wafer from the second surface,
   wherein
   the quartz crystal element which is provided with the first tilted surface and the second tilted surface, and which has a cutting angle different from the predetermined cutting angle is formed,
   the quartz crystal wafer has a plurality of element areas where the quartz crystal elements are respectively formed, and
   the quartz crystal element formed from at least one of the element areas is different in thickness from the quartz crystal element formed from another of the element areas.

2. A method of manufacturing a quartz crystal element, the method comprising:
   preparing a quartz crystal wafer which has a predetermined cutting angle with respect to a crystal axis of a quartz crystal, and which has a first surface and a second surface having an obverse-reverse relationship;
   forming a first resist film on the first surface, the first resist film having a first tilted part tilted with respect to the first surface, and being dry-etched together with the quartz crystal;
   forming a first tilted surface tilted with respect to the first surface by dry-etching the quartz crystal wafer from the first surface;
   forming a second resist film on the second surface, the second resist film having a second tilted part tilted with respect to the second surface, and being dry-etched together with the quartz crystal; and
   forming a second tilted surface tilted with respect to the second surface by dry-etching the quartz crystal wafer from the second surface,
   wherein
   the quartz crystal element which is provided with the first tilted surface and the second tilted surface, and which has a cutting angle different from the predetermined cutting angle is formed,
   the cutting angle of the quartz crystal wafer is AT cut, and
   the cutting angle of the quartz crystal element is one of SC cut, NY cut, and GT cut.

* * * * *